US012628672B2

(12) United States Patent
Lee et al.

(10) Patent No.: US 12,628,672 B2
(45) Date of Patent: May 12, 2026

(54) SEMICONDUCTOR PACKAGE

(71) Applicant: SAMSUNG ELECTRONICS CO., LTD., Suwon-si (KR)

(72) Inventors: Sangkyu Lee, Suwon-si (KR); Doohwan Lee, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 759 days.

(21) Appl. No.: 17/815,634

(22) Filed: Jul. 28, 2022

(65) Prior Publication Data

US 2023/0115073 A1 Apr. 13, 2023

(30) Foreign Application Priority Data

Oct. 12, 2021 (KR) ........................ 10-2021-0134870
Oct. 26, 2021 (KR) ........................ 10-2021-0143342

(51) Int. Cl.
H01L 23/538 (2006.01)
H01L 23/00 (2006.01)
(Continued)

(52) U.S. Cl.
CPC ........ H01L 23/5381 (2013.01); H01L 23/481 (2013.01); H01L 23/49816 (2013.01);
(Continued)

(58) Field of Classification Search
CPC ............. H01L 23/5383; H01L 23/5385; H01L 23/481; H01L 23/5386; H01L 23/498;
(Continued)

(56) References Cited

U.S. PATENT DOCUMENTS 8,227,904 B2 7/2012 Braunisch et al.
8,441,809 B2 5/2013 Mahajan et al.
(Continued)

FOREIGN PATENT DOCUMENTS

KR 10-2041661 11/2019
KR 10-2020-0099805 A 8/2020

OTHER PUBLICATIONS

Office Action dated Jul. 9, 2025 issued in corresponding to Korean Patent Application No. 10-2021-0143342.

*Primary Examiner* — Lawrence C Tynes, Jr.
(74) *Attorney, Agent, or Firm* — Morgan, Lewis & Bockius LLP

(57) ABSTRACT

A semiconductor package includes a frame having a first surface and a second surface, and including a wiring structure and a through-hole. The package further includes a first redistribution structure disposed on the first surface of the frame and including a first insulating layer and a first redistribution layer on the first insulating layer and connected to the wiring structure, a bridge die in the through-hole and having an interconnector, and an encapsulant surrounding the bridge die, and covering the second surface of the frame. The package further includes a second redistribution structure disposed on the encapsulant, and including a second insulating layer and a second redistribution layer on the second insulating layer and connected to the interconnector and the wiring structure, and a plurality of semiconductor chips disposed on the second redistribution structure, connected to the second redistribution layer, and electrically connected to each other through the interconnector.

18 Claims, 22 Drawing Sheets

(51) Int. Cl.

| | |
|---|---|
| *H01L 23/48* | (2006.01) |
| *H01L 23/498* | (2006.01) |
| *H01L 25/065* | (2023.01) |
| *H01L 21/48* | (2006.01) |
| *H01L 25/16* | (2023.01) |

(52) U.S. Cl.

CPC ...... *H01L 23/5383* (2013.01); *H01L 23/5386* (2013.01); *H01L 24/16* (2013.01); *H01L 24/32* (2013.01); *H01L 24/73* (2013.01); *H01L 25/0652* (2013.01); *H01L 21/4857* (2013.01); *H01L 21/486* (2013.01); *H01L 24/08* (2013.01); *H01L 25/16* (2013.01); *H01L 2224/08145* (2013.01); *H01L 2224/16227* (2013.01); *H01L 2224/16238* (2013.01); *H01L 2224/32225* (2013.01); *H01L 2224/73204* (2013.01); *H01L 2924/1431* (2013.01); *H01L 2924/1434* (2013.01); *H01L 2924/182* (2013.01); *H01L 2924/19041* (2013.01); *H01L 2924/3511* (2013.01); *H01L 2924/37001* (2013.01)

(58) Field of Classification Search

CPC ............. H01L 23/49822; H01L 21/485; H01L 21/486; H01L 21/6835; H01L 21/4857; H01L 2221/68345; H01L 2221/68359; H01L 24/24; H01L 24/82

See application file for complete search history.

(56) References Cited

U.S. PATENT DOCUMENTS

| | | | |
|---|---|---|---|
| 9,379,090 | B1 | 6/2016 | Syed et al. |
| 9,997,446 | B2 | 6/2018 | Kim et al. |
| 10,475,745 | B2 | 11/2019 | Liu et al. |
| 10,784,232 | B2 | 9/2020 | Hiner et al. |
| 10,872,863 | B2 | 12/2020 | Choi et al. |
| 2020/0006232 | A1 | 1/2020 | Pietambaram et al. |
| 2020/0058627 | A1 | 2/2020 | Chen et al. |
| 2020/0235065 | A1 | 7/2020 | Chang et al. |
| 2020/0243450 | A1 | 7/2020 | Cho et al. |
| 2020/0266167 | A1 | 8/2020 | Lee et al. |
| 2020/0294924 | A1 | 9/2020 | Roy et al. |
| 2020/0312767 | A1 | 10/2020 | Pietambaram et al. |
| 2020/0395313 | A1* | 12/2020 | Mallik .................. H01L 21/565 |
| 2021/0005542 | A1* | 1/2021 | Mallik .................... H01L 25/18 |
| 2021/0028147 | A1 | 1/2021 | Yu et al. |
| 2021/0050327 | A1* | 2/2021 | Shih ..................... H01L 23/5386 |
| 2021/0134728 | A1* | 5/2021 | Rubin ................. H01L 21/4853 |
| 2021/0375768 | A1* | 12/2021 | Tsou ................. H01L 23/49838 |
| 2021/0398905 | A1* | 12/2021 | Teng ................... H01L 25/0652 |

* cited by examiner

120A

125P

125

123

121

127    128

165a
165b 162a    163a    165b    h2    130T    165b    165a

161b

RC2    h1

112c
(115)    RC1

110
(110b)    125
120

121

113b    CA    130

A2

SEMICONDUCTOR PACKAGE

CROSS-REFERENCE TO RELATED APPLICATION(S)

This application claims priority under 35 U.S.C. § 119 to Korean Patent Application No. 10-2021-0134870 filed on Oct. 12, 2021, and Korean Patent Application No. 10-2021-0143342 filed on Oct. 26, 2021, the disclosures of which are incorporated by reference herein in their entireties.

TECHNICAL FIELD

Embodiments of the present inventive concept relate to a semiconductor package.

DISCUSSION OF RELATED ART

In accordance with the rapid development of the electronics industry and the needs of users, electronic devices are being miniaturized and multifunctionalized. According to such a process, a semiconductor package including a plurality of semiconductor chips is utilized. Since interconnection between the plurality of semiconductor chips may not be guaranteed by the printed circuit board, the plurality of semiconductor chips may be connected by a separate interposer.

SUMMARY

Example embodiments provide a semiconductor package having a novel interposer structure.

According to example embodiments, a semiconductor package includes a frame having a first surface and a second surface opposing each other, including a wiring structure connecting the first and second surfaces, and having a through-hole; a first redistribution structure disposed on the first surface of the frame and including a first insulating layer and a first redistribution layer disposed on the first insulating layer and connected to the wiring structure; a bridge die disposed in the through-hole and having an interconnector; an encapsulant surrounding the bridge die, extending onto the second surface of the frame, and having a substantially flat upper surface; a second redistribution structure disposed on the encapsulant, the second redistribution structure including a second insulating layer and a second redistribution layer disposed on the second insulating layer and connected to the interconnector and the wiring structure; and a plurality of semiconductor chips disposed on the second redistribution structure, connected to the second redistribution layer, and electrically connected to each other through the interconnector.

According to example embodiments, a semiconductor package includes a lower redistribution structure having a lower insulating layer and a lower redistribution layer disposed on the lower insulating layer; a frame disposed on the lower redistribution structure, including a wiring structure connected to the lower redistribution layer, and having a through-hole; a bridge die disposed on the lower redistribution structure, in the through-hole, and including a semiconductor block and an interconnector disposed on an upper surface of the semiconductor block; an encapsulant surrounding the bridge die in the through-hole, extending onto an upper surface of the frame, and having a substantially flat upper surface; an upper redistribution structure disposed on the encapsulant and including an upper insulating layer and an upper redistribution layer disposed on the upper insulating layer and connected to the interconnector; and a plurality of semiconductor chips disposed on the upper redistribution structure, connected to the upper redistribution layer, and electrically connected to each other through the interconnector.

According to example embodiments, a semiconductor package includes a lower redistribution structure having a lower insulating layer and a lower redistribution layer disposed on the lower insulating layer; a bridge die disposed on the lower redistribution structure and including a semiconductor block and an interconnector disposed on an upper surface of the semiconductor block; a plurality of conductive posts disposed around the bridge die, on the lower redistribution structure; an encapsulant disposed on the lower redistribution structure and having a substantially flat upper surface higher than upper surfaces of the bridge die and the plurality of conductive posts; an upper redistribution structure disposed on the encapsulant, including an upper insulating layer and an upper redistribution layer disposed on the upper insulating layer, the upper redistribution layer respectively connected to the interconnector of the bridge die and the plurality of conductive posts; and a plurality of semiconductor chips disposed on the upper redistribution structure, connected to the upper redistribution layer, and electrically connected to each other through the interconnector.

BRIEF DESCRIPTION OF THE DRAWINGS

The above and other features of the present inventive concept will become more apparent by describing in detail example embodiments thereof with reference to the accompanying drawings, in which.

DETAILED DESCRIPTION

Figure 1:
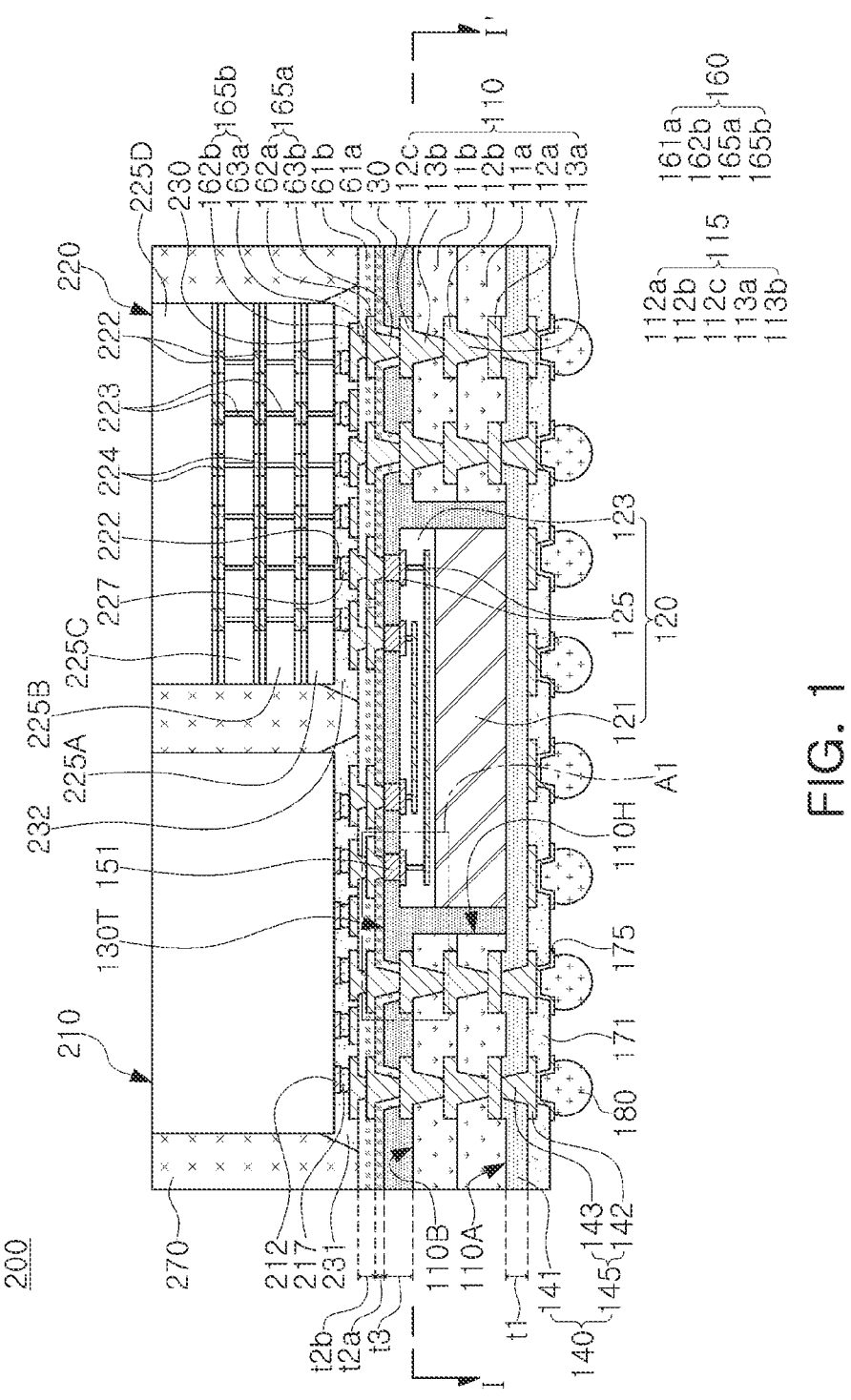
FIG. 1 is a cross-sectional view schematically illustrating a semiconductor package according to an example embodiment.

Example embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an example embodiment may be described as a "second" element in another example embodiment.

It should be understood that descriptions of features or aspects within each example embodiment should typically be considered as available for other similar features or aspects in other example embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when one value is described as being about equal to another value or being substantially the same as or equal to another value, it is to be understood that the values are identical, the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art. Other uses of the terms "substantially" and "about" should be interpreted in a like fashion. For example, when a surface of a component is described as being substantially flat, it is to be understood that the surface is exactly flat, or is almost flat (e.g., within a measurement error), as would be understood by a person having ordinary skill in the art.

Figure 2:
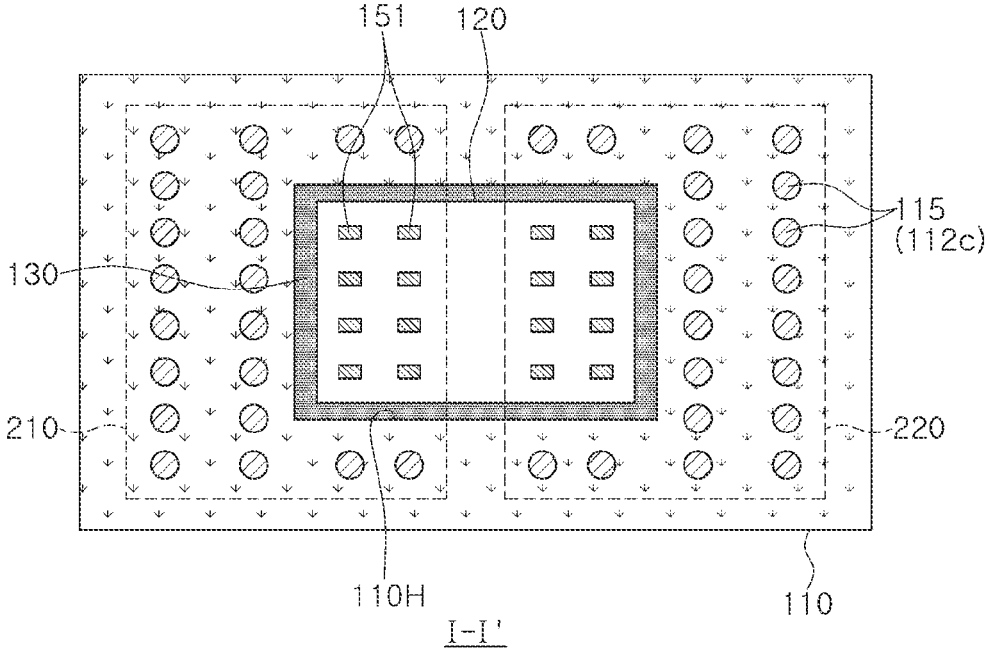
FIG. 2 is a plan view illustrating the semiconductor package of FIG. 1 taken along line I-I' according to an example embodiment.

FIG. 1 is a cross-sectional view schematically illustrating a semiconductor package according to an example embodiment, and FIG. 2 is a plan view illustrating the semiconductor package of FIG. 1 taken along line I-I' according to an example embodiment.

Referring to FIGS. 1 and 2, a semiconductor package 200 according to an example embodiment may include an organic material-based interposer structure having a bridge die 120 embedded therein, and a first semiconductor chip 210 and a second semiconductor chip 220 mounted on the interposer structure and interconnected through the bridge die 120. Examples of the interposer structure are described in further detail with reference to FIGS. 9 and 10 (see 100A and 100B).

The interposer structure employed in an example embodiment according to FIGS. 1 and 2 includes a frame 110 having a first surface (also, referred to as "lower surface") 110A and a second surface (also, referred to as "upper surface") 110B positioned opposite to each other and having a through-hole 110H, the bridge die 120 disposed in the through-hole 110H and having an interconnector, an encapsulant 130 surrounding the bridge die 120 and extending onto the second surface 110B of the frame 110, a first redistribution structure (also, referred to as a "lower redistribution structure") 140 disposed on the first surface 110A of the frame 110, and a second redistribution structure (also, referred to as an "upper redistribution structure") 160 disposed on the encapsulant 130.

For example the frame 110 employed in an example embodiment according to FIGS. 1 and 2 includes a first insulating layer 111*a*, a first wiring layer 112*a* buried in the first insulating layer 111*a*, a second wiring layer 112*b* disposed on a surface opposite to the surface of the first insulating layer 111*a* in which the first wiring layer 112*a* is buried, a second insulating layer 111*b* disposed on a surface opposite to the surface of the first insulating layer 111*a* in which the first wiring layer 112*a* is buried and covering at least a portion of the second wiring layer 112*b*, and a third wiring layer 112*c* disposed on a surface opposite to the surface of the second insulating layer 111*b* in which the second wiring layer 112*b* is buried. The first and second wiring layers 112*a* and 112*b* and the second and third wiring layers 112*b* and 112*c* may be electrically connected to each other through the first and second wiring vias 113*a* and 113*b* penetrating through the first and second insulating layers 111*a* and 111*b*, respectively.

A wiring structure 115 employed in an example embodiment according to FIGS. 1 and 2 is illustrated in a form including three wiring layers 112*a*, 112*b*, and 112*c* and wiring vias 113*a* and 113*b* connecting the same, but is not limited thereto. For example, according to example embodiments, the wiring structure 115 may be implemented to have a different number of layers or various structures.

The frame 110 may secure the rigidity of the interposer structure according to the material of the insulating layers 111a and 111b. For example, the insulating layers 111a and 111b may include a thermosetting resin such as an epoxy resin, a thermoplastic resin such as polyimide, or a resin in which these resins and an inorganic filler are mixed (e.g., Ajinomoto Build-up Film (ABF)). In some embodiments, the insulating layers 111a and 111b may be resins (e.g., prepregs) impregnated with a material such as glass fibers (e.g., Glass Fiber, Glass Cloth, Glass Fabric, etc.) together with or in place of inorganic fillers.

In some embodiments, the first to third wiring layers 112a, 112b, and 112c and the first and second wiring vias 113a and 113b may include copper (Cu), but the materials are not limited thereto. For example, according to embodiments, the first to third wiring layers 112a, 112b, and 112c and the first and second wiring vias 113a and 113b may include a conductive material such as aluminum (Al), silver (Ag), tin (Sn), gold (Au), nickel (Ni), lead (Pb), titanium (Ti), or alloys thereof. The second and third wiring layers 112b and 112c may have an integrated structure with the first and second wiring vias 113a and 113b, respectively. For example, the integrated structure may be formed using a plating process.

Each of the first to third wiring layers 112a, 112b, and 112c may have a thickness greater than a thickness of the redistribution layer, for example, a thickness greater than a thickness of each of the first and second redistribution patterns 142 and 162.

The bridge die 120 may be disposed on the first redistribution structure 140, in the through-hole 110H. The bridge die 120 may be provided as a bridge structure for interconnecting the first semiconductor chip 210 and the second semiconductor chip 220.

Figure 3:
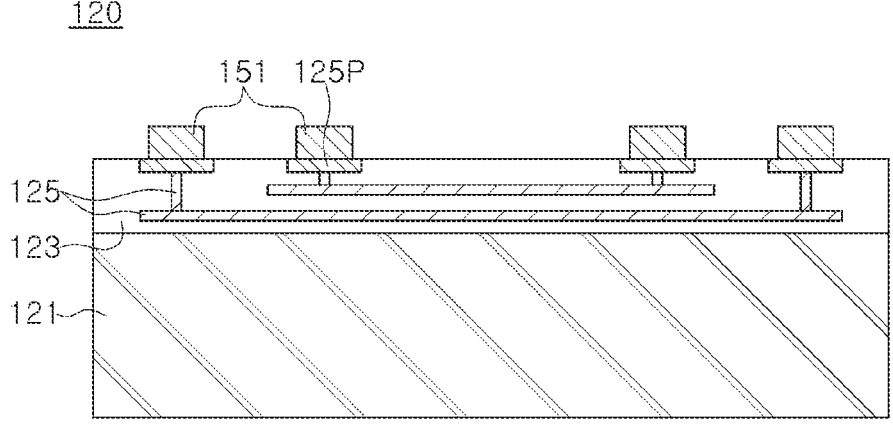
FIG. 3 is a cross-sectional view illustrating an example of a semiconductor bridge employable in the semiconductor package of FIG. 1.

FIG. 3 is a cross-sectional view illustrating an example of the bridge die 120 employed in a semiconductor package 200 of FIG. 1.

Referring to FIG. 3, the bridge die 120 employed in an example embodiment includes a semiconductor block 121, a dielectric layer 123 disposed on the upper surface of the semiconductor block 121, and an interconnector 125 formed in the dielectric layer 123. In this specification, the bridge die 120 may be referred to as a "semiconductor bridge". The interconnector 125 may include contact pads 125P disposed on the upper surface of the bridge die 120. The semiconductor block 121 may be, for example, a silicon (Si) block. The interconnector 125 may include conductor patterns and a via connecting the conductor patterns. The conductor pattern and the via may be formed as fine structures, using a semiconductor process. The conductor pattern of the interconnector 125 may have a width smaller than the width of the redistribution patterns 142 and 162. For example, the width and the spacing of the conductor patterns may be about 1 μm or less, and about 1 μm or less, respectively.

The encapsulant 130 has a portion that surrounds the bridge die 120 within the through-hole 110H and extends onto the upper surface of the frame 110, as described above. The encapsulant 130 employed in an example embodiment may have a substantially flat upper surface 130T. The substantially flat upper surface 130T may be a surface obtained by a planarization process such as a grinding process. By flattening the upper surface of the encapsulant 130 and lowering the surface roughness thereof, a fine circuit (e.g., line width/spacing: about 5 μm or less/about 5

μm or less) of the second redistribution structure 160 may be implemented, and the bonding yield of the first and second semiconductor chips 210 and 220 may be increased. For example, the surface roughness Ra of the substantially flat upper surface 130T may be about 10 μm or less.

For example, the encapsulant 130 may include a thermosetting resin such as an epoxy resin, a thermoplastic resin such as polyimide, or a resin in which these resins contain a reinforcing material such as an inorganic filler therein. In some embodiments, the encapsulant 130 may include ABF. Embodiments of the present inventive concept are not limited thereto. For example, according to embodiments, the encapsulant 130 may be formed of Frame Retardant 4 (FR-4), Bismaleimide triazine (BT), or resin.

The first redistribution structure 140 disposed on the first surface 110A of the frame 110 may include a first insulating layer 141 and a first redistribution layer 145 disposed on the first insulating layer 141 and electrically connected to the wiring structure 115. The first redistribution layer 145 may be connected to a portion (also referred to as a "lower pad") of the first wiring layer 112a of the wiring structure 115 through a first redistribution via 143.

Similarly, the second redistribution structure 160 disposed on the encapsulant 130 may include second insulating layers 161a and 161b, and second redistribution layers 165a and 165b disposed on the second insulating layers 161a and 161b and electrically connected to the wiring structure 115 and the interconnector 125. The second redistribution layers 165a and 165b may be connected to a portion (also referred to as an "upper pad") of the third wiring layer 112c of the wiring structure 115 through second redistribution vias 163a and 163b.

As such, the first redistribution layer 145 and the second redistribution layer 165 may be vertically connected through the wiring structure 115.

For example, the first and second insulating layers 141 and 161 may include a photoimageable dielectric (PID) material. Via holes of the first and second insulating layers 141, 161a, and 161b may be precisely formed using a photolithography process. The first and second redistribution layers 145, 165a, and 165b may be formed by a plating process.

The bridge die 120 may include conductive bumps 151 positioned on the contact pads 125P. The second redistribution via 163a may be connected to the conductive bump 151, such that the second redistribution layers 165a and 165b may be electrically connected to the interconnector 125 of the bridge die 120. The first and second semiconductor chips 210 and 220 are respectively connected to the interconnector 125 of the bridge die 120 through the second redistribution layers 165a and 165b, and thus, the interconnector 125 may be provided as a signal path for interconnecting the first and second semiconductor chips 210 and 220.

As such, in the semiconductor package 200 according to an example embodiment, the first and second semiconductor chips 210 and 220 may be mounted on the second redistribution structure 160, and the bonding pads 212 and 224 of the first and second semiconductor chips 210 and 220 may be electrically connected to the second redistribution layer 165b using connection bumps 217 and 227, respectively. In addition, the second redistribution layer 165a may be electrically connected to the first redistribution layer 145 through the wiring structure 115, and may be connected to the interconnector 125 of the bridge die 120 through the conductive bump 151. A connection structure of the second redistribution layers 165a and 165b employed according to an example embodiment is illustrated in detail in FIG. 4.

Figure 4:
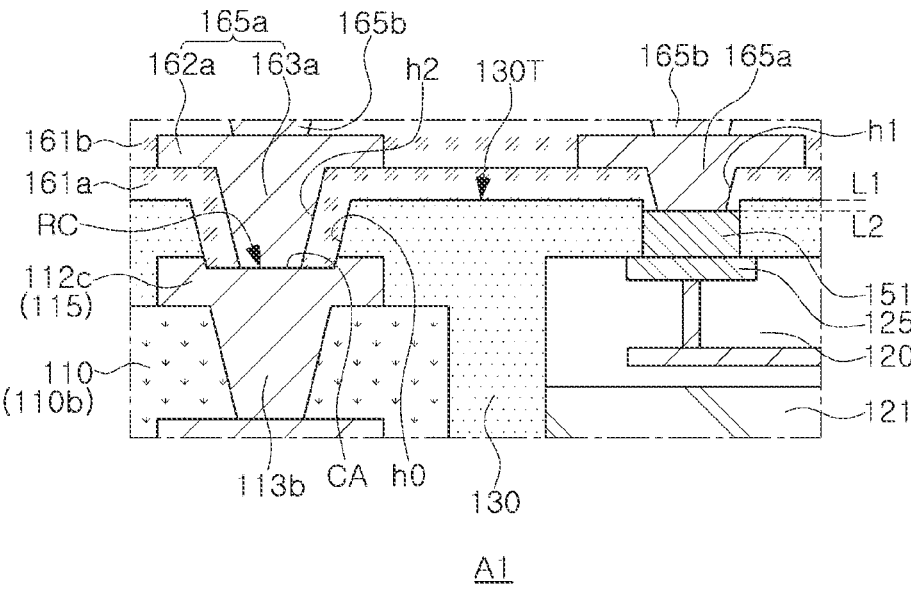
FIG. 4 is an enlarged cross-sectional view of area "A1" of the semiconductor package of FIG. 1.

FIG. 4 is an enlarged cross-sectional view of area "A1" of the semiconductor package of FIG. 1 according to an example embodiment.

Referring to FIG. 4, an upper surface of the bridge die 120 may be at a level that is the same as or higher than the second surface 110B of the frame 110. The encapsulant 130 is formed to cover the second surface 110B of the frame 110 and the upper surface of the bridge die 120. The upper surface of the conductive bump 151 may be exposed from the substantially flat upper surface 130T of the encapsulant 130, and the contact area of the third wiring layer 112c of the wiring structure 115 may be exposed by a hole h0 of the encapsulant 130. In an example embodiment according to FIG. 4, the upper surface of the conductive bump 151 may have a level L2 lower than a level L1 of the upper surface 130T of the encapsulant 130. This level adjustment may be generated by an etching and post-treatment process (see FIG. 12C) for removing foreign substances after a planarization process such as grinding (see FIG. 12B). For example, the upper surface of the conductive bump 151 may be lower than the substantially flat upper surface 130T of the encapsulant 130 by about 0.2 μm to about 5 μm.

Similarly, a contact area CA of the third wiring layer 112c may have a lower recessed area RC than other areas covered by the encapsulant 130. The recessed area RC may be formed by an etching and post-processing process for removing foreign substances (refer to FIG. 12C) after the hole forming process (refer to FIG. 12B). For example, the depth of the recessed area RC may be in the range of about 0.2 μm to about 5 μm, similar to the lowered level range L1-L2.

In some embodiments, leveling down and recessed areas may not be introduced. For example, the upper surface of the conductive bump may have substantially the same level as the upper surface of the encapsulant in an example embodiment.

In an example embodiment according to FIG. 4, the second insulating layers 161a and 161b may include two insulating layers, for example, a lower insulating layer and an upper insulating layer, and the second redistribution layers 165a and 165b may include two redistribution layers, for example, a lower redistribution layer and an upper redistribution layer.

The lower insulating layer 161a may be disposed on the upper surface 130T of the encapsulant 130 and may have a first hole h1 exposing the upper surface of the first conductive bump 151, and a second hole h2 exposing the contact area CA. The lower redistribution layer 165b is formed on the lower insulating layer 161a. The lower redistribution layer 165a may include a via 163a connected to the first conductive bump 151 through the first hole h1, and a redistribution pattern 162a having a via 163a connected to the contact area CA through the second hole h2.

In an example embodiment according to FIG. 4, the upper insulating layer 161b may be formed on the lower insulating layer 161a to cover the lower redistribution layer 165a, and the upper redistribution layer 165b may be formed on the upper insulating layer 161b. The upper redistribution layer 165b may include a redistribution pattern 162b connected to the lower redistribution layer 165a by a via 163b penetrating through the upper insulating layer 161b.

The interposer structure according to an example embodiment of FIG. 4 may have improved warpage characteristics by adjusting the thickness of each layer according to the characteristics of the coefficient of thermal expansion.

The insulating layers 111a and 111b of the frame 110 corresponding to the core each have a higher modulus than a modulus of the first and second insulating layers 141 and 161 and the encapsulant 130. For example, the coefficient of thermal expansion (CTE) of the insulating layers 111a and 111b of the frame 110 may be in the range of about 4 to about 10 ppm/° C., and the modulus thereof may be in the range of about 20 to about 40 GPa. In addition, the first and second insulating layers 141 and 161 and the encapsulant 130 may have a relatively high coefficient of thermal expansion. For example, the coefficient of thermal expansion (CTE) of the encapsulant 130 may be in the range of about 10 to about 25 ppm/° C. and the modulus thereof may be in the range of about 10 to about 20 GPa. In addition, the first and second insulating layers 141 and 161 may have a higher coefficient of thermal expansion than that of the encapsulant 130. Unwanted warpage may be caused due to the thickness deviation between an insulating material portion (e.g., the first insulating layer 141) on the first surface 110A of the frame 110 and an insulating material portion (e.g., a cover portion of the encapsulant 130 and the second insulating layers (161a, 161b)) on the second surface 110B of the frame 110.

To prevent or decrease unwanted warpage, in an example embodiment, a total thickness (t2a+t2b) of the second insulating layers 161a and 161b may be designed to be about equal to or less than a total thickness t1 of the first insulating layer 141.

In some embodiments, the first insulating layer 141 may include at least one insulating layer, and the second insulating layers 161a and 161b may include a plurality of insulating layers stacked on the upper surface of the encapsulant 130. As such, the number of layers of the first insulating layer 141 may be lower than that of the second insulating layers 161a and 161b. In this case, the respective thicknesses t2a and t2b of the second insulating layers 161a and 161b may be smaller than the thickness t1 of the at least one first insulating layer 141. In addition, the two second insulating layers 161a and 161b may have the same or different thicknesses. In addition, a planarization process such as grinding may be introduced to reduce a thickness t3 of the cover portion of the encapsulant 130 to reduce the thickness deviation of the upper and lower structures. In an example embodiment, the first insulating layer 141 may include one insulating layer, and the second insulating layers 161a and 161b may include 2 or 3 insulating layers stacked on the upper surface of the encapsulant 130.

As such, even when using an organic material-based interposer structure by the panel level package (PLP) process, warpage characteristics, which in a comparative example are typically inferior to those of a silicon interposer, may be significantly improved by adjusting the thickness of the upper and lower structures of the frame 110.

The semiconductor package 200 according to an example embodiment may include first and second semiconductor chips 210 and 220 mounted on the organic material-based interposer structure. The first and second semiconductor chips 210 and 220 partially overlap the bridge die 120 embedded in the interposer structure, and complex signal lines in the PHY region may be interconnected by the bridge die 120. In a plan view of the semiconductor package 200 (refer to FIG. 2), a planar area of the interposer may be smaller than a planar area of each of the first and second semiconductor chips 210 and 220.

According to embodiments, the first semiconductor chip 210 is a single logic chip, and for example, may be implemented as a microprocessor, a graphics processor, a signal processor, a network processor, a chipset, an audio codec, a video codec, an application processor, a system on chip, etc., but is not limited thereto. The first semiconductor chip 210 may include a semiconductor substrate having an active surface and an inactive surface opposing each other, and a bonding pad 212 disposed on a lower surface of the semiconductor substrate. The bonding pad 212 may be connected to the second redistribution pattern 162*b* by the connection bump 217. The bonding region of the second redistribution pattern 162*b* may include a surface treatment layer P formed to function as a pad. The surface treatment layer P is not particularly limited, and may be formed by, for example, electrolytic gold plating, electroless gold plating, OSP or electroless tin plating, electroless silver plating, electroless nickel plating/substitution plating, DIG plating, HASL, etc., but the formation method is not limited thereto.

The second semiconductor chip 220 employed in an example embodiment may include a high bandwidth memory chip. The second semiconductor chip 220 may include a plurality (e.g., four) of memory chips 225A, 225B, 225C, and 225D that are stacked and connected to each other. The plurality of memory chips 225A, 225B, 225C, and 225D may each include a semiconductor substrate each having an active surface and an inactive surface opposing each other, a through electrode 223 penetrating through the semiconductor substrate, upper pads 224 (also referred to as bonding pads) and lower pads 222 (also referred to as bonding pads). An upper pad 224 of one memory chip (e.g., 225A, 225B, or 225C) may be connected to a lower pad 222 of an adjacent memory chip (e.g., 225B, 225C, or 225D). In an example embodiment, an uppermost memory chip 225D does not include the through electrode 223 and the upper pads 224. A lower pad 222 of a lowermost memory chip 225A may be connected to the second redistribution pattern 162*b* by the connection bump 227.

In a system in package in which a plurality of individual semiconductor chips are integrated into one package, the number of memory chips constituting the second semiconductor chip 220 may vary depending on the usage of the semiconductor package 200. For example, the number of memory chips constituting the second semiconductor chip 220 is not limited to the number illustrated in the drawings. Memory chips constituting the second semiconductor chip 220 may be laminated by being adhered to each other through an adhesive member. The adhesive member may be a non-conductive film.

In some embodiments, the second semiconductor chip 220 may include a volatile memory chip and/or a non-volatile memory chip. The volatile memory chip may be, for example, a dynamic random access memory (DRAM), static RAM (SRAM), thyristor RAM (TRAM), zero capacitor RAM (ZRAM), or twin transistor RAM (TTRAM). In addition, the non-volatile memory chip may be, for example, a flash memory, a magnetic RAM (MRAM), a spin-transfer torque MRAM (STT-MRAM), a ferroelectric RAM (FRAM), a phase change RAM (PRAM), a resistive RAM (RRAM), a nanotube RRAM, a polymer RAM, or an insulator resistance change memory.

Underfills 231 and 232 surrounding the connection bumps 217 and 227 may be formed between each of the first and second semiconductor chips 210 and 220 and the second redistribution structure 160. The underfills 231 and 232 may stably fix the first and second semiconductor chips 210 and 220 on the interposer structure. For example, the underfills 231 and 232 may be formed of a curable resin such as epoxy.

The molded portion 270 may seal at least side surfaces of the first and second semiconductor chips 210 and 220 to protect the first and second semiconductor chips 210 and 220 from the external environment. In the case of the molded portion 270, an appropriate amount of molding resin is injected into the upper surface of the interposer structure by an injection process, and the outer shape of the semiconductor package 200 may be formed through a curing process. In some embodiments, the molding resin may include an epoxy-group molding resin or a polyimide-group molding resin. The molded portion 270 may serve to protect the first and second semiconductor chips 210 and 220 from external influences such as impacts. In some embodiments, the molded portion 270 may surround upper surfaces of the first and second semiconductor chips 210 and 220. In some embodiments, the molded portion 270 may be formed to expose upper surfaces of the first and second semiconductor chips 210 and 220.

A passivation layer 171 may be formed on a lower surface of the first redistribution structure 140, and an opening of the passivation layer 171 may be formed to form a UBM layer 175. External connection conductors 180 may be respectively formed on the UBM layer 175.

Figure 5:
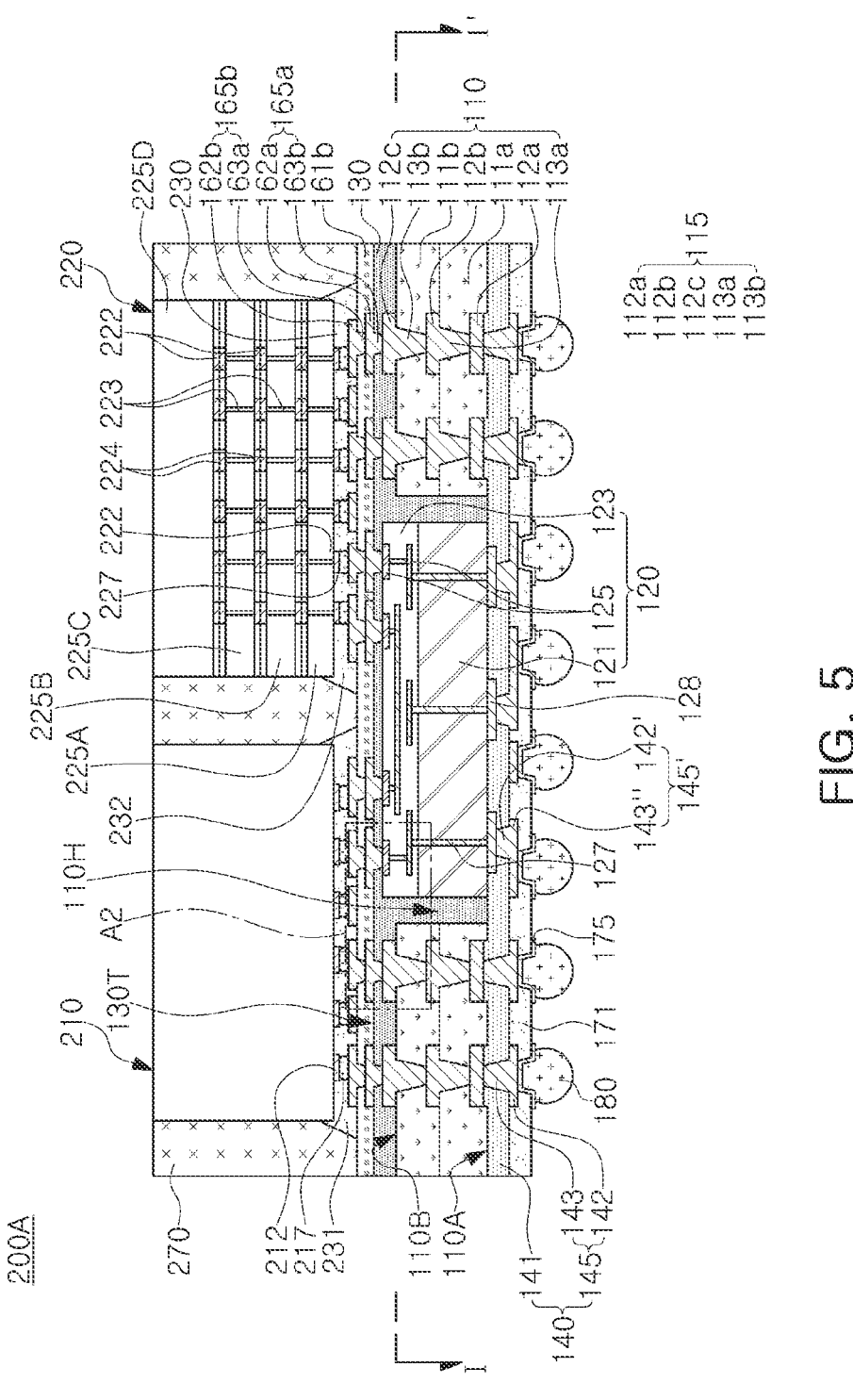
FIG. 5 is a cross-sectional view illustrating a semiconductor package according to an example embodiment.
Figure 6:
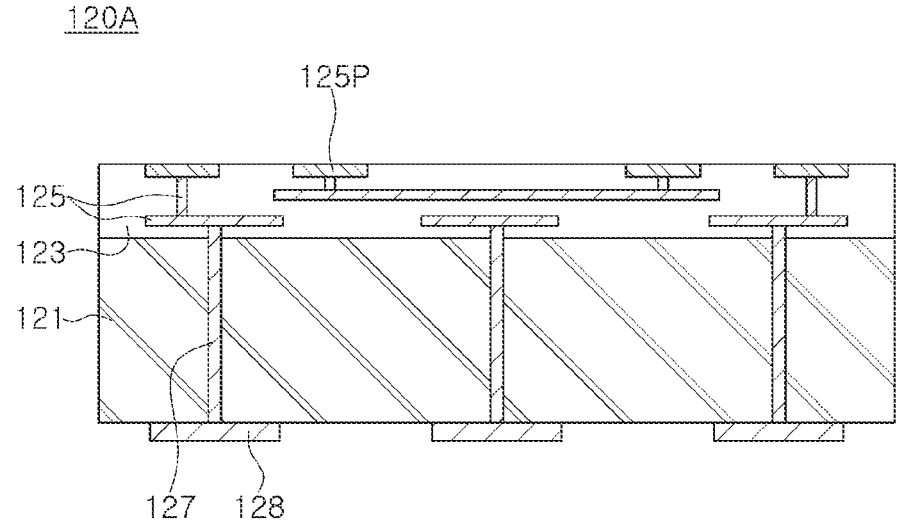
FIG. 6 is a cross-sectional view illustrating a semiconductor bridge employable in the semiconductor package of FIG. 5.

FIG. 5 is a cross-sectional view illustrating a semiconductor package according to an example embodiment. FIG. 6 is a cross-sectional view illustrating a semiconductor bridge employable in the semiconductor package of FIG. 5 according to an example embodiment.

Referring to FIG. 5, a semiconductor package 200A according to an example embodiment may be understood as being similar to the semiconductor package 200 described with reference to FIGS. 1 to 4, except that a bridge die 120A having a different structure is employed and the method of forming the second redistribution structure 160 is different. Descriptions of the components with reference to the following figures may refer to descriptions of the same or similar components of the semiconductor package 200 illustrated in FIGS. 1 to 4, unless otherwise specifically stated, and for convenience of explanation, a further description of components and technical aspects previously described will be omitted.

Referring to FIG. 6, similar to an example embodiment according to FIGS. 1 to 4, the bridge die 120A may include a semiconductor block 121, a dielectric layer 123 disposed on the upper surface of the semiconductor block 121, and an interconnector 125 formed in the dielectric layer 123. The interconnector 125 may include contact pads 125P disposed on the upper surface of the bridge die 120. Unlike an example embodiment according to FIGS. 1 to 4, the bridge die 120A includes a through-via 127 penetrating through the semiconductor block 121 and connected to the interconnector 125.

A contact pad 128 connected to the through-via 127 is disposed on a lower surface of the bridge die 120A, and as illustrated in FIG. 5, the first redistribution layer 145' may be connected to a contact pad 128 on the lower surface of the bridge die 120A. The first redistribution layer 145' may include a first redistribution pattern 142' positioned on the first insulating layer 141, and a via 143' connected through the first insulating layer 141.

In addition, in an example embodiment, the bridge die employed may be directly connected to the second redistribution layer 165 without a conductive bump (refer to 151 in FIG. 1) on the contact pad 125P. A connection form of the second redistribution layer will be described with reference to FIG. 7.

Figure 7:
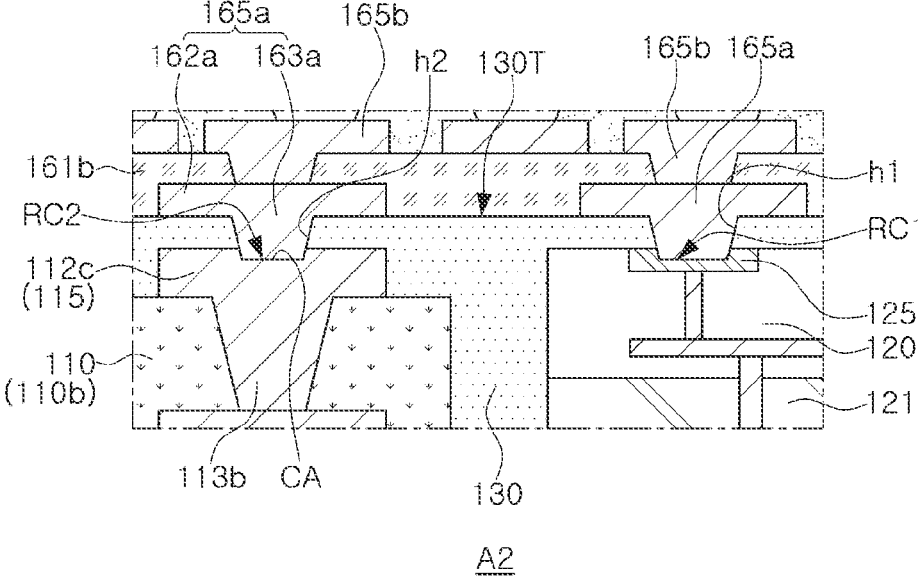
FIG. 7 is an enlarged cross-sectional view of area "A2" of the semiconductor package of FIG. 5 according to an example embodiment.

FIG. 7 is an enlarged cross-sectional view of area "A2" of the semiconductor package 200A of FIG. 5 according to an example embodiment.

Referring to FIG. 7, the encapsulant 130 covers the second surface 110B of the frame 110 and the upper surface of the bridge die 120. The encapsulant 130 has a substantially flat upper surface 130T, and has a first hole h1 through which the contact area CA of the third wiring layer 112c is exposed, and a second hole h2 through which a contact pad 125P of the bridge die 120 is exposed. In an example embodiment, portions exposed by the first and second holes h1 and h2 have recessed areas RC1 and RC2, respectively.

Figure 13A:
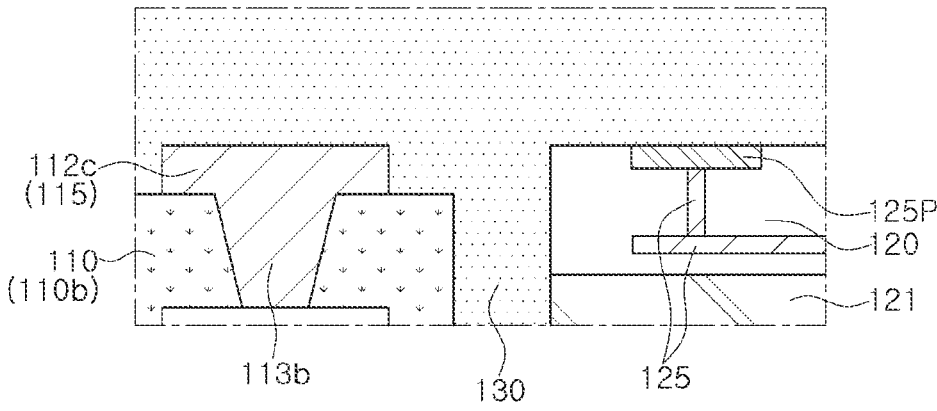
FIGS. 13A to 13D are cross-sectional views illustrating another example of a process of forming a second redistribution structure.
Figure 13B:
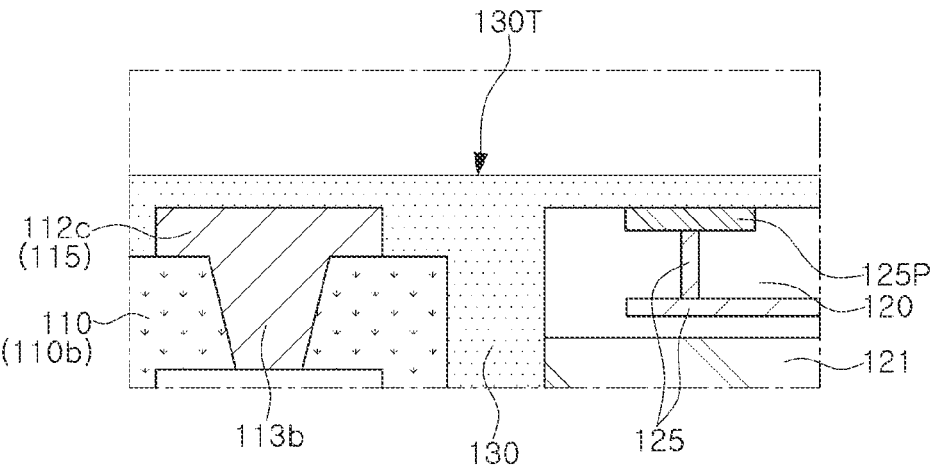
Figure 13C:
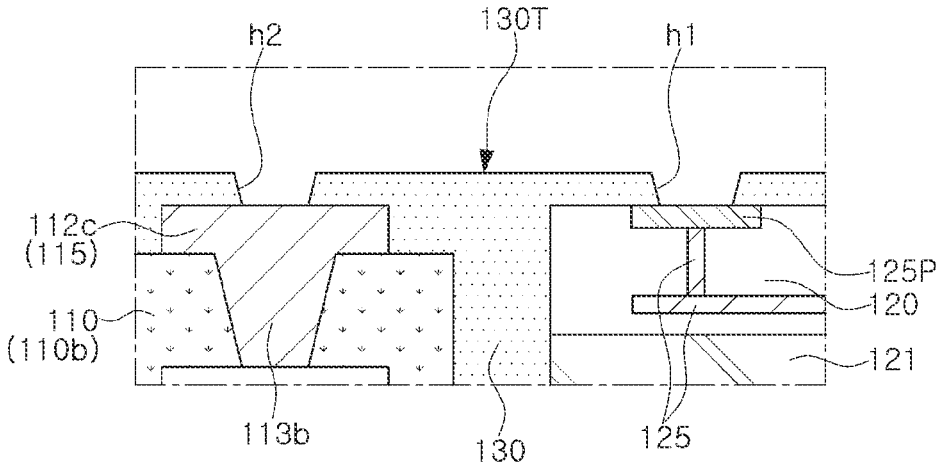

The recessed areas RC1 and RC2 may be generated by a planarization process such as grinding (refer to FIG. 13B), followed by an etching and post-processing process for removing foreign substances (refer to FIG. 13C). For example, each of the depths of the recessed areas RC1 and RC2 may be in a range of about 0.2 μm to about 5 μm.

The second redistribution structure 160 employed in an example embodiment according to FIG. 7 may include one second insulating layer 161b and lower and upper redistribution layers 165a and 165b. In an example embodiment according to FIG. 7, the second insulating layer 161 is not included. The lower redistribution layer 165a is formed directly on the upper surface 130T of the encapsulant 130 and is respectively connected to the contact area CA of the third wiring layer 112c and the contact pad 125P of the bridge die 120. The second insulating layer 161b is formed on the encapsulant 130 to cover the lower redistribution layer 165a, and the upper redistribution layer 165b is formed on the second insulating layer 161 and may penetrate through the second insulating layer 161b and be connected to the lower redistribution layer 165b.

Figure 8:
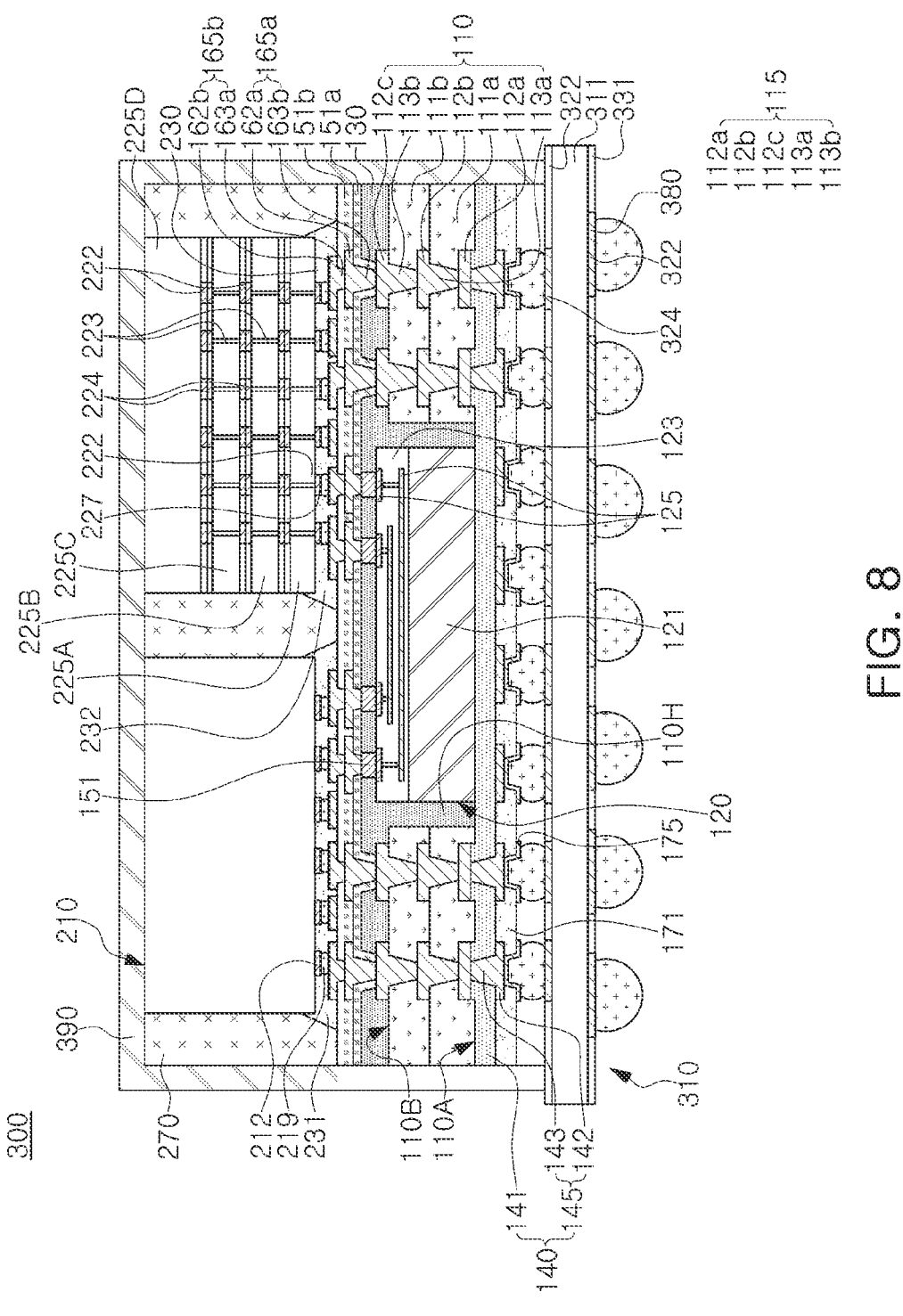
FIG. 8 is a cross-sectional view illustrating a semiconductor package according to an example embodiment.

FIG. 8 is a cross-sectional view illustrating a semiconductor module according to an example embodiment.

Referring to FIG. 8, a semiconductor module 300 according to an example embodiment may include a package substrate 310 on which the semiconductor package 200 illustrated in FIG. 1 is mounted. The package substrate 310 may include a substrate body 311, and a first pad 322 and a second pad 324 disposed on a lower surface and an upper surface of the substrate body 311, respectively. For convenience of explanation, a further description of components and technical aspects previously described will be omitted.

The package substrate 310 in an example embodiment may be a printed circuit board. For example, the package substrate 310 may be a multi-layer printed circuit board. The substrate body 311 may be formed of at least one of, for example, phenol resin, epoxy resin, and polyimide. For example, the substrate body 311 may include at least one of FR4, tetrafunctional epoxy, polyphenylene ether, epoxy/polyphenylene oxide, Bismaleimide triazine (BT), thermount, cyanate ester, polyimide, and liquid crystal polymer.

A first solder resist layer 332 and a second solder resist layer 334 exposing the first pad 322 and the second pad 324 may be formed on the lower surface and the upper surface of the substrate body 311, respectively. An external connection terminal 380 may be connected to the first pad 322, and an external connection conductor 180 of the semiconductor package 200 may be connected to the second pad 324. The package substrate 310 may include a wiring pattern electrically connecting the first pad 322 and the second pad 324, and a via electrically connecting the wiring patterns.

The semiconductor module 300 in an example embodiment may further include a heat dissipation member 390. The heat dissipation member 390 may be, for example, a heat slug or a heat sink. The heat dissipation member 390 may be in contact with the upper surface of the package substrate 310 and may surround the semiconductor package 200. The heat dissipation member 390 may be configured to directly contact the upper surfaces of the first and second semiconductor chips 210 and 220, but the configuration is not limited thereto.

In some embodiments, a thermal interface material (TIM) layer may be disposed between the heat dissipation member 390 and upper surfaces of the first and second semiconductor chips 210 and 220. In some embodiments, in the case of the heat dissipation member 390, an electromagnetic interference (EMI) shielding layer may be formed, and the EMI shielding layer may be electrically connected to a ground layer of the package substrate 310.

Figure 9:
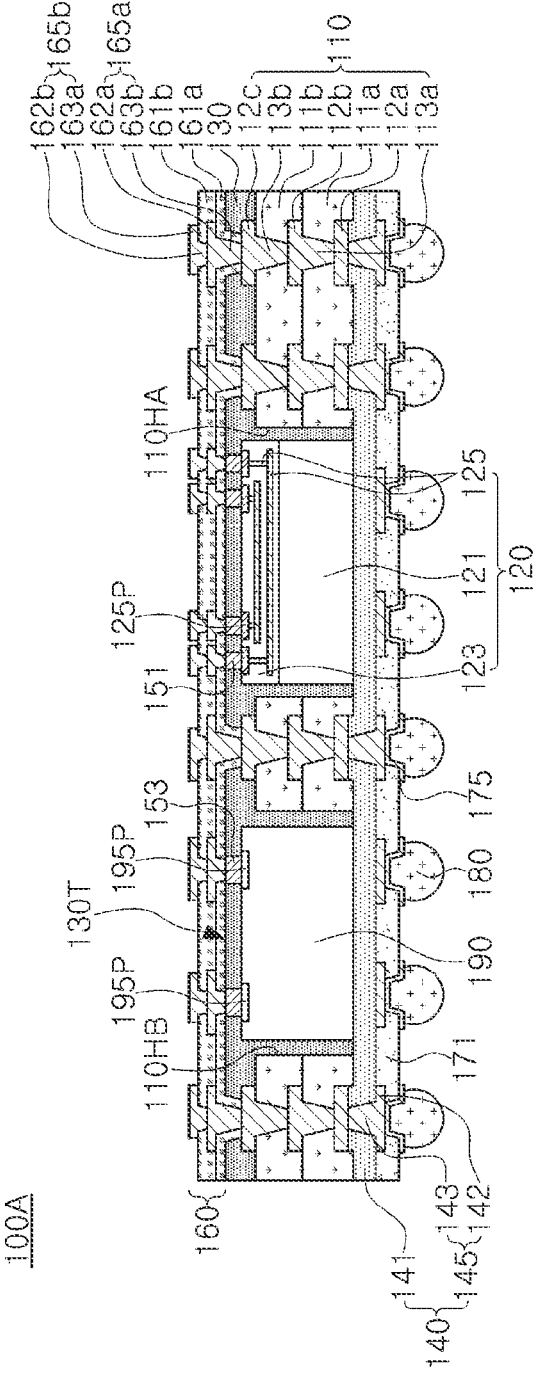
FIGS. 9 and 10 are cross-sectional views illustrating semiconductor packages according to various example embodiments, respectively.
Figure 10:
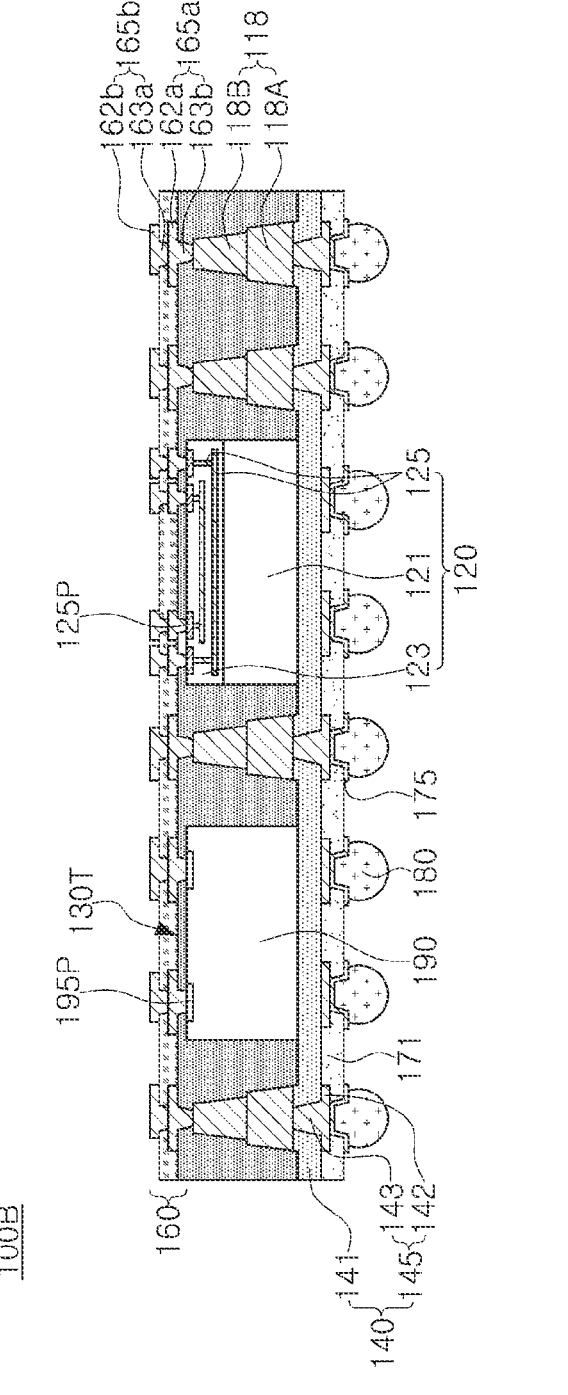

FIGS. 9 and 10 are cross-sectional views illustrating various examples of an interposer structure, which may be employable in a semiconductor package according to an example embodiment of the present inventive concept.

First, referring to FIG. 9, an interposer structure 100A according to an example embodiment may be understood as being similar to the interposer structure described with reference to FIGS. 1, 2 and 4, except that a frame 110 has a plurality (e.g., two) of through-holes 110HA and 110HB, and a chip capacitor 190 is embedded in one through-hole 110HB. The descriptions of the components with reference to FIGS. 9 and 10 may refer to the descriptions of the same or similar components of the interposer structure illustrated in FIGS. 1, 2, and 4, unless otherwise specifically stated, and for convenience of explanation, a further description of components and technical aspects previously described will be omitted.

The frame 110 in an example embodiment has first and second through-holes 110HA and 110HB. As described previously, the first through-hole 110HA may include the bridge die 120, and the second through-hole 110HB may include the chip capacitor 190. The chip capacitor 190 may be, for example, an integrated stacked capacitor (ISC) chip. The ISC chip may include a semiconductor block, and a capacitor layer and a wiring layer formed on the upper surface of the semiconductor block, similar to the bridge die 120. A contact pad 195P is disposed on the upper surface of the chip capacitor 190, and the contact pad 195P may be connected to each of the second redistribution layers similar to the bridge die 120. In an example embodiment, the bridge die 120 further includes conductive bumps 151 on the contact pads 125P, and the chip capacitor 190 may further include conductive bumps 153 on the contact pads 195P. The second redistribution layer 165 of the second redistribution structure 160 may be connected to the bridge die 120 and the chip capacitor 190 through respective conductive bumps 151 and 153. The connection structure of the second redistribution structure 160 according to an example embodiment of FIG. 9 may be understood in more detail with reference to FIG. 4.

Referring to FIG. 10, an interposer structure 100B according to an example embodiment may be understood as being similar to the interposer structure described with reference to FIGS. 1, 2 and 4, except for having a conductive post 118 in place of the frame having a wiring structure (110 in FIG. 1), and except that the chip capacitor 190 is embedded together with the bridge die 120 in the encapsulant 130. The descriptions of the components with reference to FIG. 10 may refer to the descriptions of the same or similar components of the interposer structure illustrated in FIGS. 1, 2, and 4, unless otherwise specifically stated, and for convenience of explanation, a further description of components and technical aspects previously described will be omitted.

The interposer structure 100B according to an example embodiment of FIG. 10 may include a first redistribution structure 140, a bridge die 120 and a chip capacitor 190 disposed on the first redistribution structure 140, a plurality of conductive posts 118 disposed around the bridge die 120 and the chip capacitor 190, disposed on the first redistribution structure 140, an encapsulant 130 disposed on the first redistribution structure 140 and having a substantially flat upper surface disposed at a higher level than upper surfaces of the bridge die 120 and the chip capacitor 190 and the plurality of conductive posts 118, and a second redistribution structure 160 disposed on the encapsulant 130.

The second redistribution structure 160 may include contact pads 125P and 195P of the chip capacitor 190 and the bridge die 120, and a second redistribution layer 165 respectively connected to the plurality of conductive posts 118. In an example embodiment according to FIG. 10, the second redistribution layer 165 may be directly connected to the respective contact pads 125P and 195P by a via 163 formed through a hole of the encapsulant 130. In some embodiments, as illustrated in FIG. 9, conductive bumps may be formed on the respective contact pads 125P and 195P, and the second redistribution layer 165 may be connected to the second redistribution layer 165 through the conductive bumps.

The conductive post 118 employed in this embodiment may be provided as a path for vertically connecting the first redistribution layer 145 and the second redistribution layer 165, similar to the wiring structure 115 of the frame illustrated in FIG. 1. The conductive posts 118 may be formed by a plurality (e.g., two) of plating processes to form a desired height. As a result, as illustrated in FIG. 10, the conductive post 118 may include a first stage 118A having a first width and a second stage 118B having a second width smaller than the first width.

FIGS. 11A to 11E are cross-sectional views illustrating some processes (e.g., processes included in an interposer manufacturing process) of a method of manufacturing a semiconductor package according to an example embodiment. The manufacturing method according to an example embodiment may be understood as the manufacturing method of the semiconductor package illustrated in FIGS. 1 to 4.

Figure 11A:
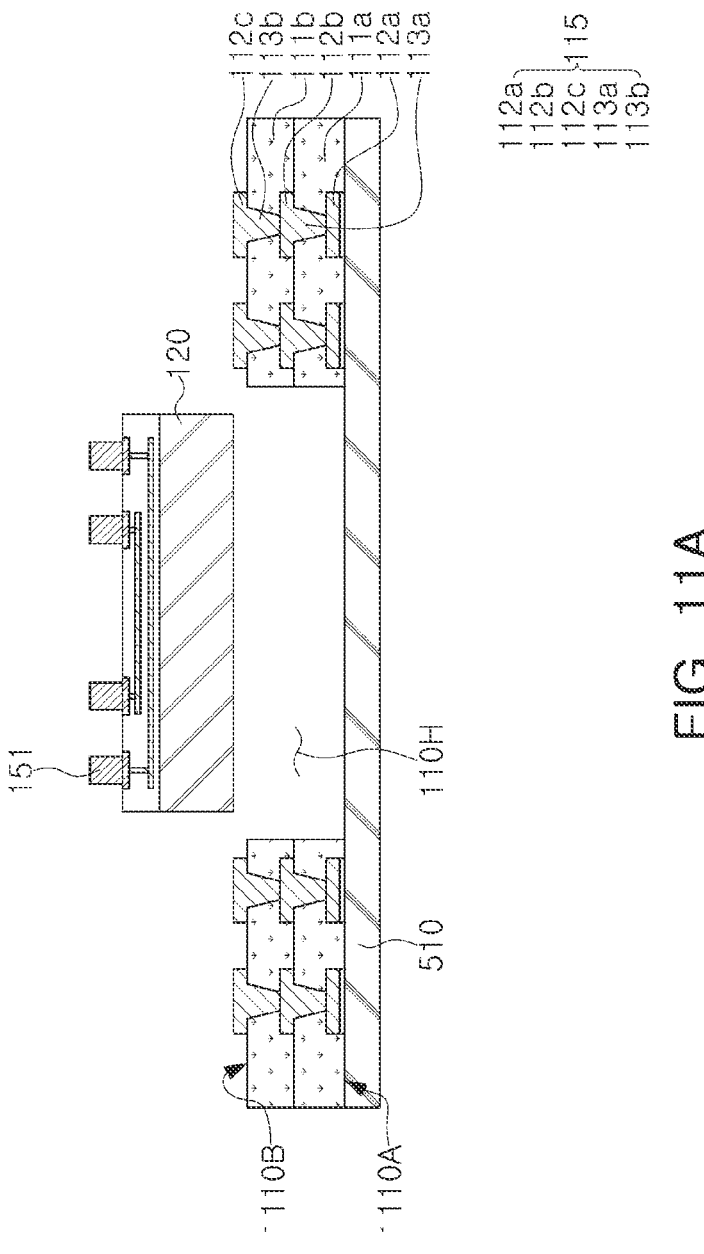
FIGS. 11A to 11E are cross-sectional views illustrating some processes (e.g., processes included in an interposer manufacturing process) of a method of manufacturing a semiconductor package according to an example embodiment.

Referring to FIG. 11A, a through-hole 110H is formed in the frame 110 having the wiring structure 115, and the frame 110 is disposed on the first support 510. Next, the bridge die 120 is disposed in the through-hole 110H.

Contact pads 125P are arranged on the upper surface of the bridge die 120, and a conductive bump 151 having a first height is formed on the contact pad 125P. The upper surface of the bridge die 120 may be the same as or higher than the second surface 110B of the frame 110, and the upper surface of the conductive bump 151 has a higher level than the upper surface of the third wiring layer 112c located on the second surface 110B of the frame 110.

Figure 11B:
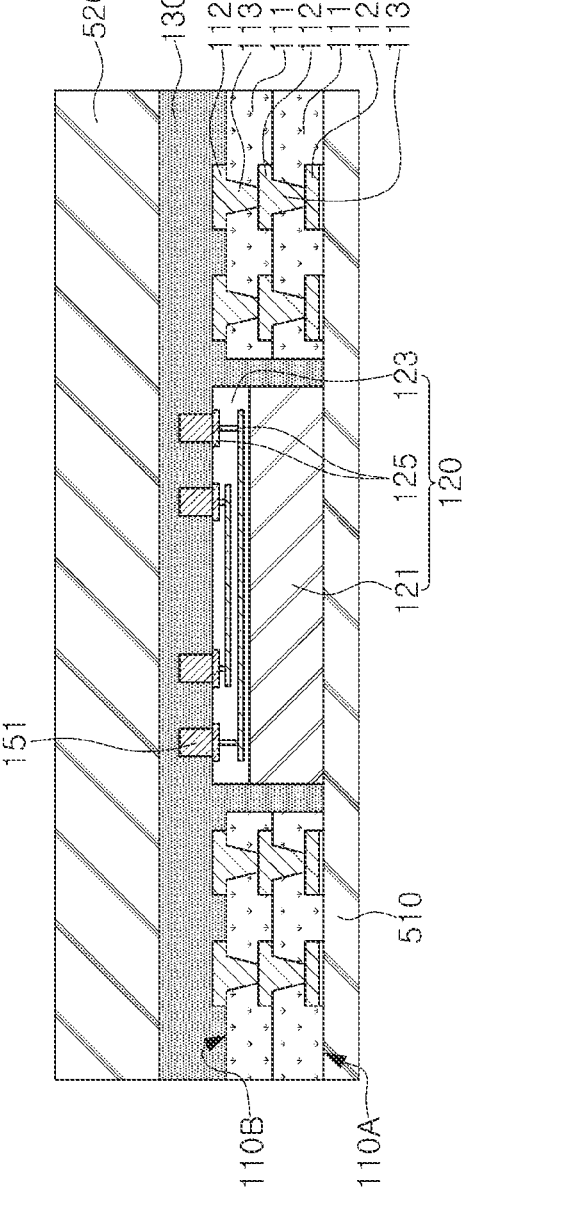

Referring to FIG. 11B, the encapsulant 130 is formed to cover the second surface 110B of the frame 110 while surrounding the bridge die 120 disposed in the through-hole 110H.

The encapsulant 130 is formed to be at a higher level than the upper surface of the conductive bump 151 to cover the conductive bump 151 of the bridge die 120. Next, the second support 520 is disposed on the upper surface of the encapsulant 130.

Figure 11C:
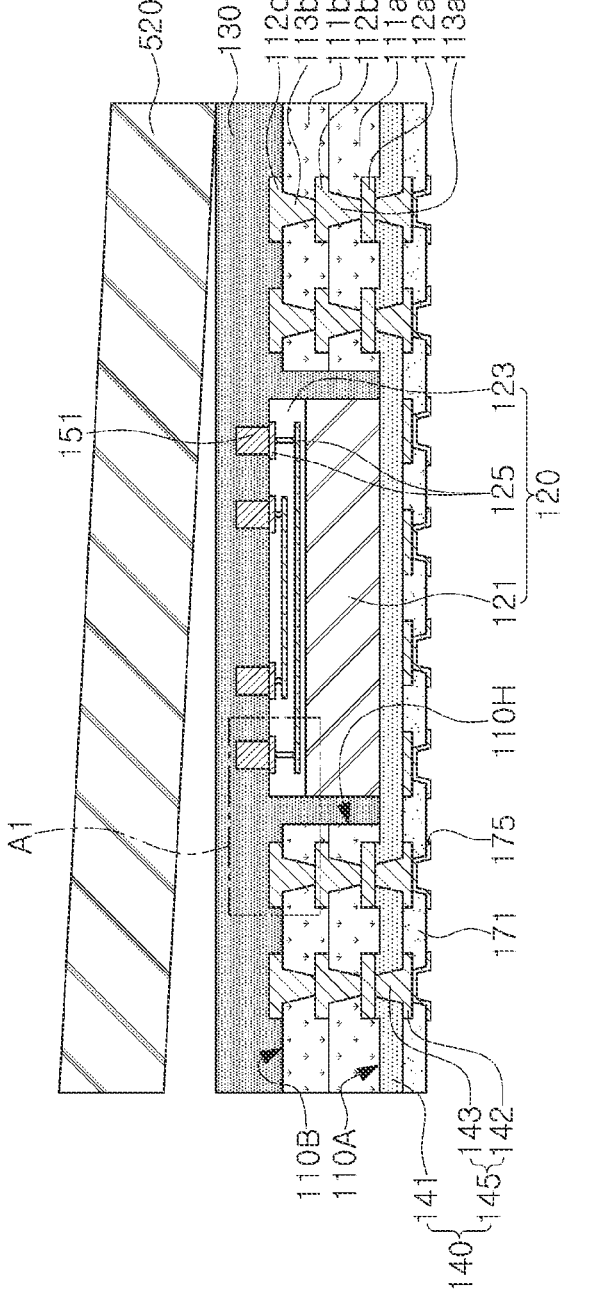

Referring to FIG. 11C, after the first support 510 is removed, the first redistribution structure 140 is formed, and the second support 520 is removed from the upper surface of the encapsulant 130.

The process of forming the first redistribution structure 140 includes a process of forming the first insulating layer

141 of the PID material on the surface from which the first support 510 has been removed. Next, a hole through which the contact area (the first wiring layer 112a) is exposed may be formed in the first insulating layer 141 using a photolithography process, and the first redistribution layer 145 may be formed using a plating process. Additionally, the passivation layer 171 may be formed on the first redistribution structure 140, and an opening of the passivation layer 171 may be formed to form the UBM layer 175.

Figure 11D:
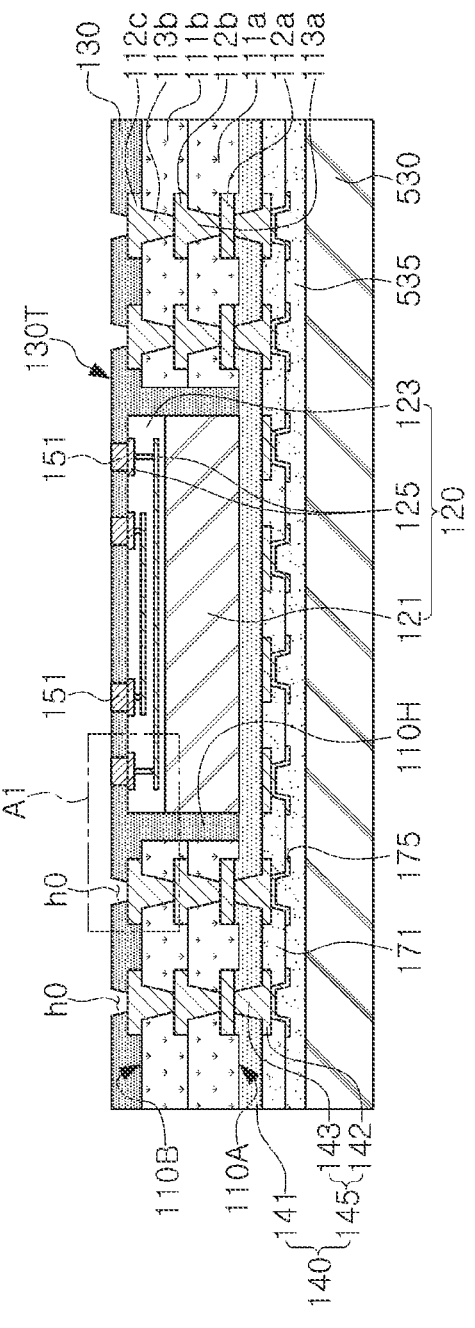

Referring to FIG. 11D, the encapsulant 130 is ground down to expose the conductive bumps 151, and a hole h0 is formed in the grounded down encapsulant 130 to open the contact area of the third wiring layer 112c.

By the grinding process, the upper surface 130T of the encapsulant 130 may have a relatively high flatness in which a fine pattern such as a redistribution layer may be precisely formed. In this process, the conductive bumps 151 may have an upper surface having a second height lower than the first height and substantially coplanar with the upper surface 130T of the encapsulant 130. In addition, the warpage issue described herein may be reduced or prevented by controlling the thickness of the encapsulant 130 positioned on the second surface 110B of the frame 110 to be relatively thin. In this case, the hole h0 exposing the contact area may be formed using a laser drilling process.

Figure 11E:
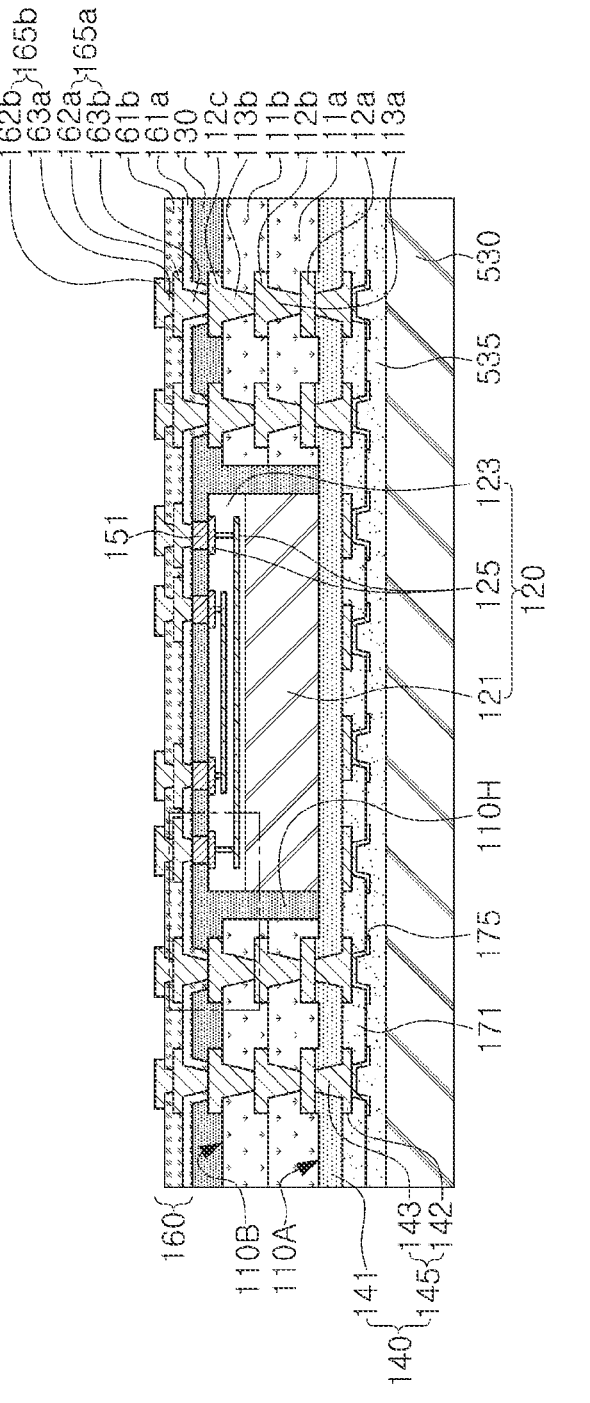

Referring to FIG. 11E, a third support 530 is bonded to the surface on which the first redistribution structure 140 is formed, using an adhesive material layer 535, and the second redistribution structure 160 is formed on the upper surface 130T of the encapsulant 130.

In this process, the second redistribution structure 160 may be formed on the upper surface 131 of the planarized encapsulant 130. For example, the adhesive material layer 535 may include an ultraviolet curable resin or glue. The second redistribution structure 160 includes second insulating layers 161a and 161b and second redistribution layers 165a and 165b. In an example embodiment, each of the second insulating layers 161a and 161b and the second redistribution layers 165a and 165b may include two layers. The second redistribution layers 165a and 165b may be respectively connected to the contact area of the third wiring layer 112c and the conductive bump 151. The second redistribution structure 160 may be formed in a process similar to the process of forming the first redistribution structure 140 described above.

The planarization process of the encapsulant and the formation process of the second redistribution structure 160 in an example embodiment will be described with reference to FIGS. 12A to 12D.

FIGS. 12A to 12D are cross-sectional views illustrating an example of a process of forming the second redistribution structure 160.

Figure 12A:
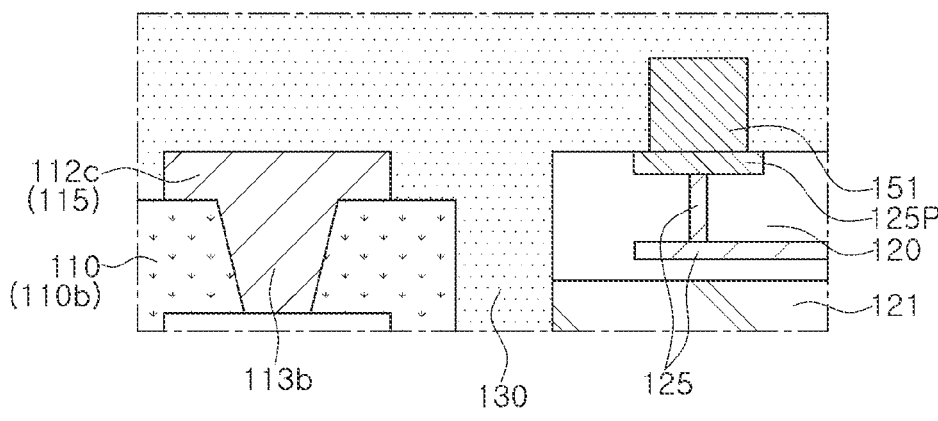
FIGS. 12A to 12D are cross-sectional views illustrating an example of a process of forming a second redistribution structure.

Referring to FIG. 12A, the area "A1" of FIG. 11C is enlarged. The encapsulant 130 is formed to be higher than the upper surface of the conductive bump 151 to cover the conductive bump 151 of the bridge die 120.

Figure 12B:
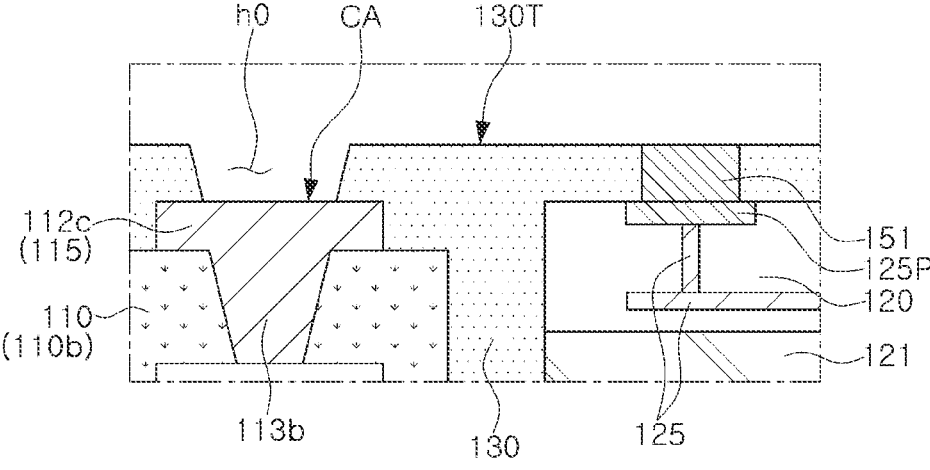

Referring to FIG. 12B, the area "A1" of FIG. 11D is enlarged. After grinding the encapsulant 130 to expose the conductive bumps 151, a hole h0 is formed to expose contact area CA of the third wiring layer 112c, by using a laser drill in the encapsulant 130.

Figure 12C:
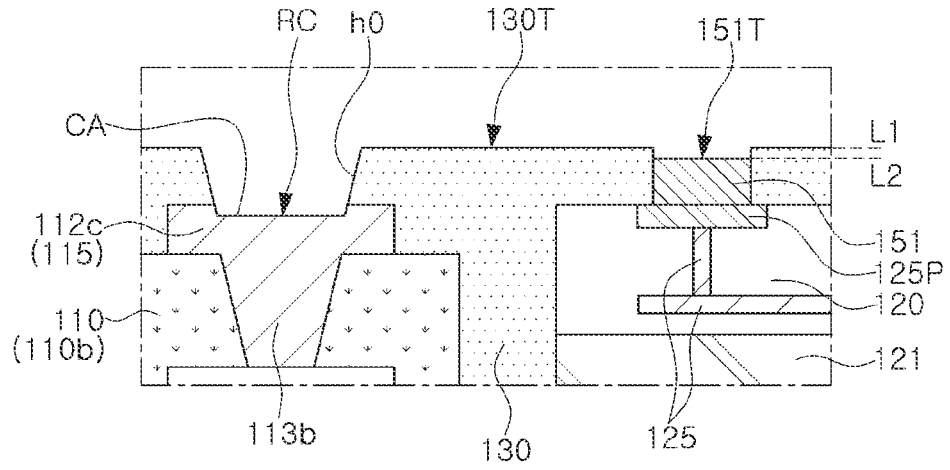

Referring to FIG. 12C, a post-treatment cleaning process (e.g., etching) may be performed to remove foreign substances generated by the grinding process and the laser drilling process, and in this process, the upper surface level L2 of the conductive bump 151 is lower than the level L1 of the substantially flat upper surface 130T of the encapsulant 130, and similarly, the contact area CA of the third wiring layer 112c may have a recessed area RC lower than the other areas covered by the encapsulant 130. In the case in which the same post-processing process is applied, the depth of the recessed area RC and the lowered levels L1 to L2 may have similar ranges. For example, the range may be in the range of about 0.2 μm to about 5 μm.

Figure 12D:
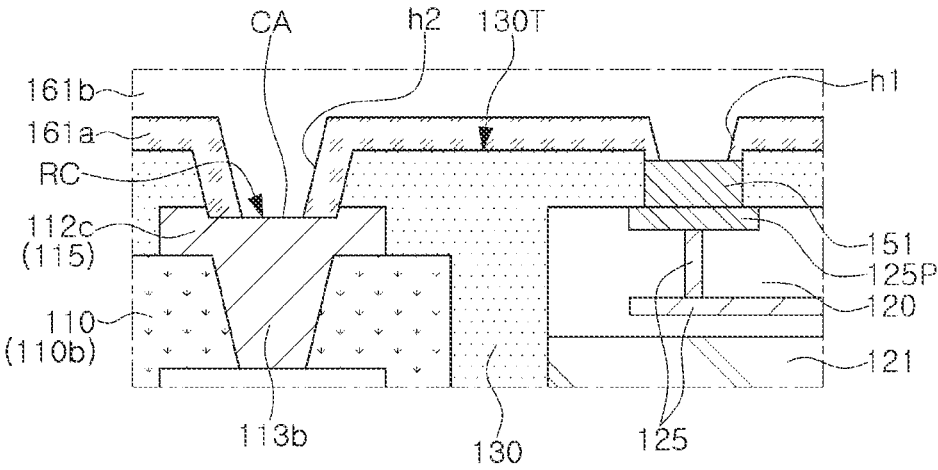

Referring to FIG. 12D, to form the second redistribution structure 160, a second insulating layer 161a is formed of a PID material, and a first hole h1 exposing the conductive bump 151 and a second hole h2 exposing the contact area CA may be formed in the second insulating layer 161a, using a photolithography process. Additionally, the second redistribution layer 165a is formed using a plating process, and the process of forming the second insulation layer 161b and the second redistribution layer 165b are repeated once to form the second redistribution structure 160 illustrated in FIG. 11E.

Figure 15A:
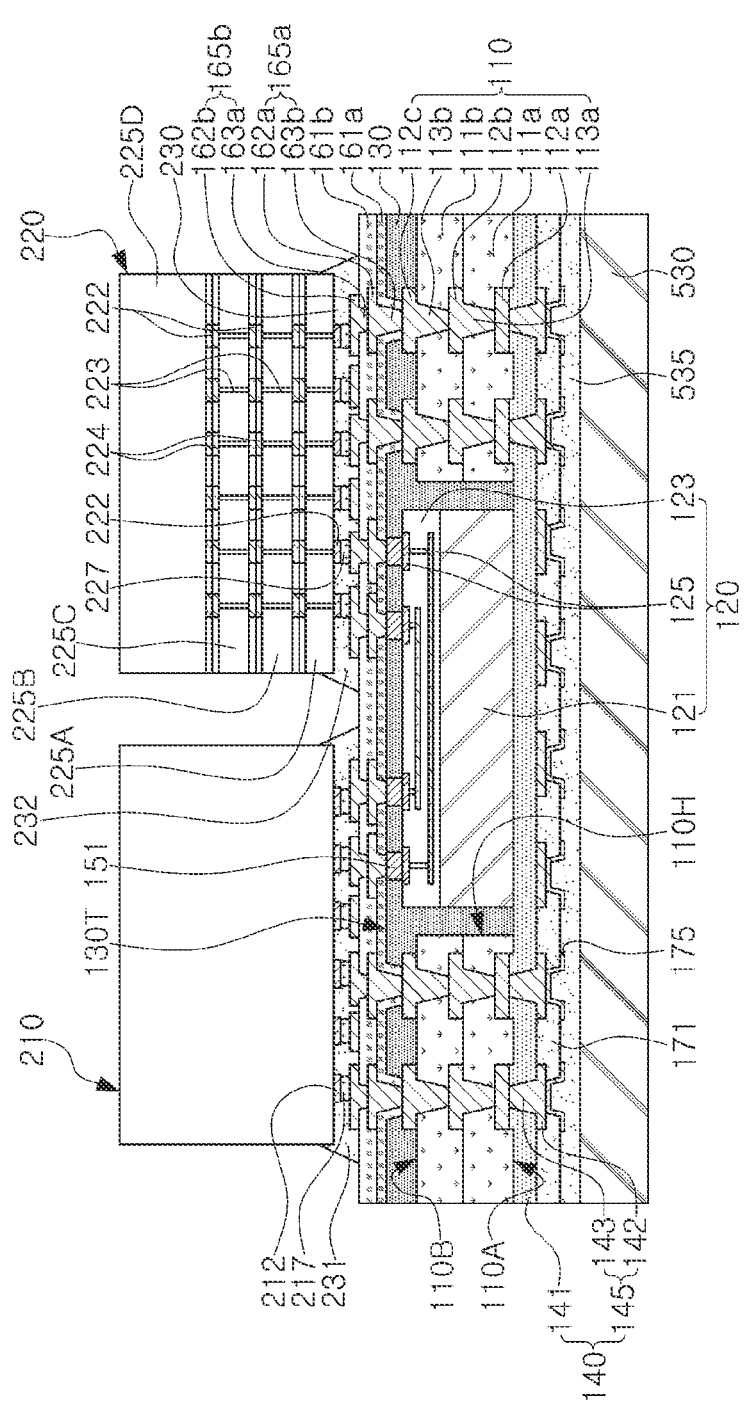
FIGS. 15A to 15C are cross-sectional views illustrating processes (e.g., a semiconductor chip mounting process) of the method of manufacturing a semiconductor package according to an example embodiment.
Figure 15B:
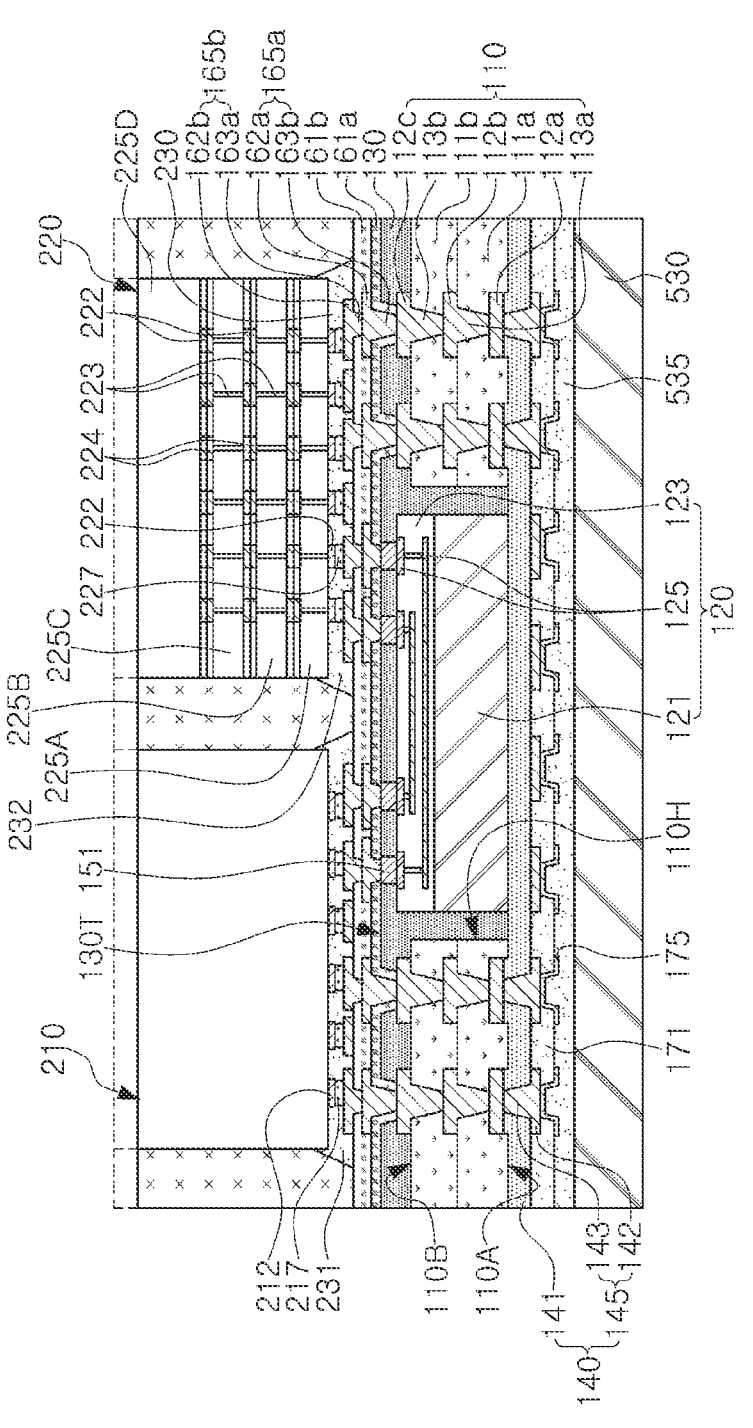
Figure 15C:
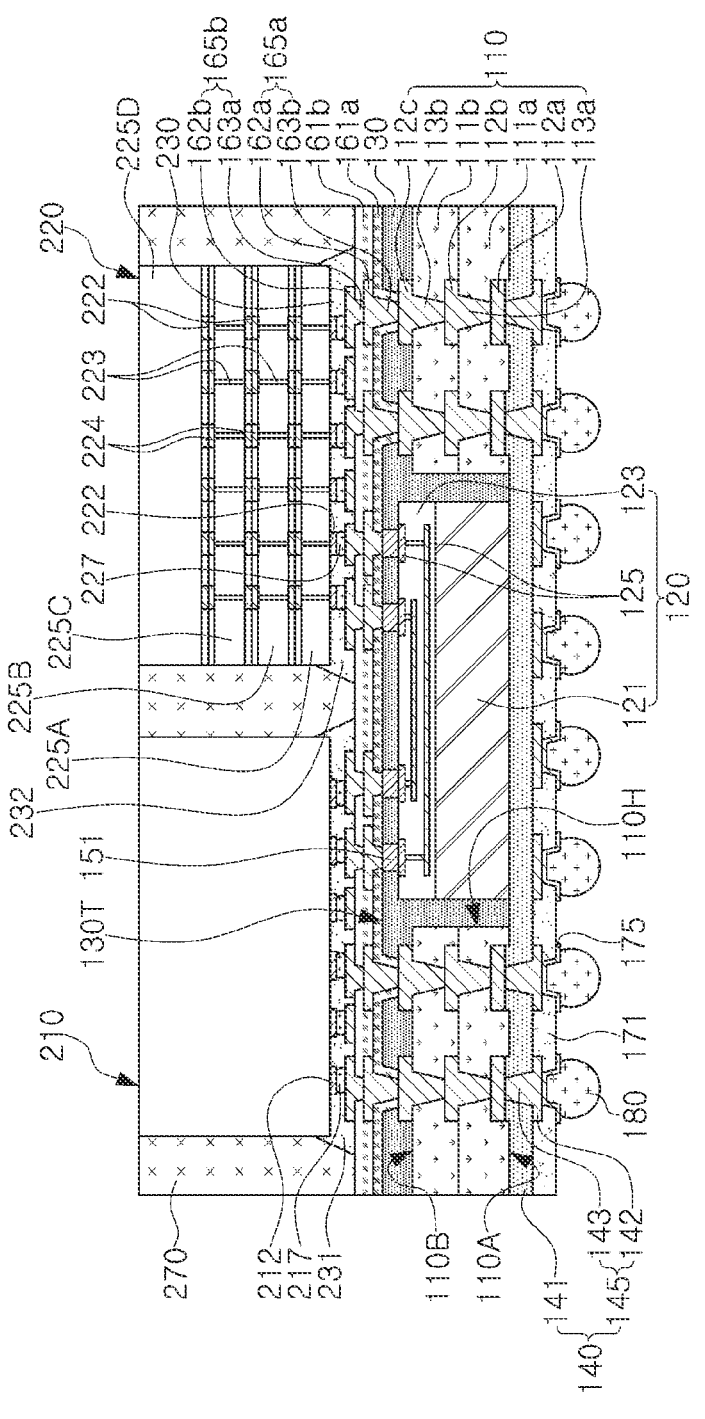

FIGS. 15A to 15C are cross-sectional views illustrating some other processes (e.g., a semiconductor chip mounting process) of the method of manufacturing a semiconductor package according to an example embodiment.

Referring to FIG. 15A, the first semiconductor chip and the second semiconductor chip are mounted on the interposer structure.

The bonding pads 212 and 224 of the first and second semiconductor chips 210 and 220 may be electrically connected to the second redistribution layer 165b using connection bumps 217 and 227, respectively. Underfills 231 and 232 surrounding the connection bumps 217 and 227 may be formed between each of the first and second semiconductor chips 210 and 220 and the second redistribution structure 160. The underfills 231 and 232 may stably fix the first and second semiconductor chips 210 and 220 on the interposer structure.

Referring to FIG. 15B, a molded portion 270 is formed on the upper surface of the interposer structure 100 to seal the first and second semiconductor chips 210 and 220, and then, the upper surfaces of the first and second semiconductor chips 210 and 220 may be exposed from the upper surface of the molded portion 270 by grinding the molded portion 270. Next, referring to FIG. 15C, after the third support 530 is removed, the external connection conductor 180 may be formed on the UBM layer 175 to complete the semiconductor package 200.

The planarization process of the encapsulant and the process of forming the second redistribution structure may be implemented in various forms other than the processes illustrated in FIGS. 12A to 12D.

Referring to FIGS. 13A to 13D, an example of a process for implementing the second redistribution layer connection form illustrated in FIG. 7 is illustrated.

Referring to FIG. 13A, the encapsulant 130 may be formed to cover the upper surface of the bridge die 120 and the second surface 110B of the frame 110. In an example embodiment, conductive bumps are not introduced onto the contact pads 125P of the bridge die 120 and on the third wiring layer 112c of the frame 110. For example, the encapsulant 130 may be formed to have a height that may also cover the contact pad 125P of the bridge die 120 and the third wiring layer 112c of the frame 110.

Referring to FIG. 13B, after grinding to reduce the thickness of the encapsulant, a first hole h1 exposing the contact pad 125P of the bridge die 120, and a second hole h2 exposing the contact area CA of the third wiring layer 112c, are formed in the encapsulant 130, using laser drilling. In an example embodiment, the thickness of the encapsulant 130 covering the second surface 110B of the frame 110 may be further reduced compared to, for example, an example embodiment according to FIG. 12B. Accordingly, warpage characteristics may be more effectively improved by more efficiently balancing the upper and lower structures of the frame 110.

Referring to FIG. 13C, a post-treatment cleaning process (e.g., etching) may be performed to remove foreign substances generated by the grinding process and the laser drilling process, and in this process, the exposed region of the contact pad 125P of the bridge die 120, and the contact area CA of the third wiring layer 112c, may have lower recessed areas RC1 and RC2 than other areas covered with the encapsulant 130.

Figure 13D:
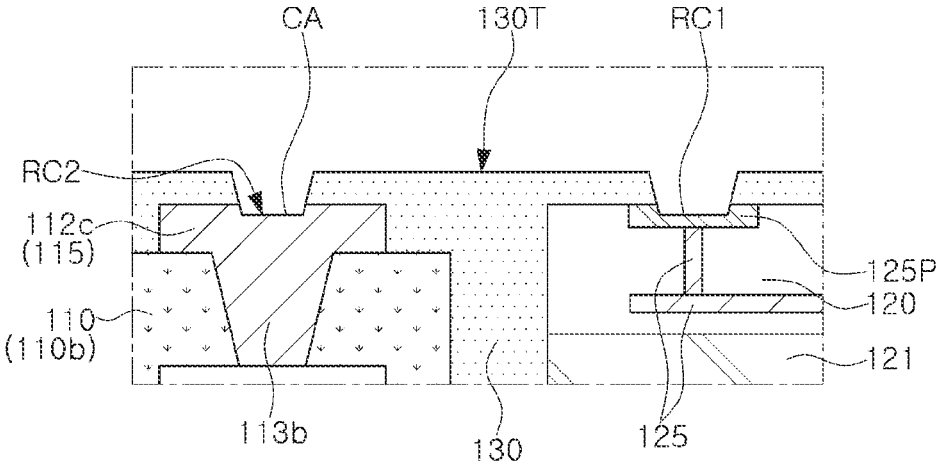

Referring to FIG. 13D, in an example embodiment, in the process of forming the second redistribution structure, the second redistribution layer may be formed on the upper surface of the encapsulant. The second redistribution layer 165a may be respectively connected to the contact pad 125P and the contact area CA of the third wiring layer 112c through the first and second holes. Next, a second insulating layer 161 is formed of a PID material, a hole exposing a portion of the second redistribution layer 165a is formed in the second insulating layer 161 using a photolithography process, and an additional second redistribution layer 165b is formed, thereby forming the second redistribution structure 160 illustrated in FIGS. 5 and 7.

FIGS. 14A to 14D are cross-sectional views illustrating another example of a process of forming a second redistribution structure.

Figure 14A:
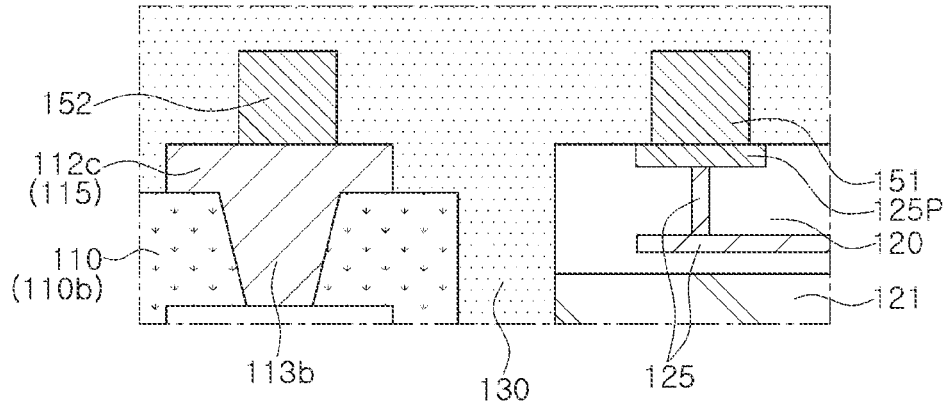
FIGS. 14A to 14D are cross-sectional views illustrating another example of a process of forming a second redistribution structure.

Referring to FIG. 14A, the encapsulant 130 may be formed to have a thickness that covers the first conductive bump 151 on the bridge die 120 and the second conductive bump 152 on the frame 110. The first conductive bumps 151 may be formed on the contact pads 125P of the bridge die 120, and the second conductive bumps 152 may be formed on the third wiring layer 112c.

Figure 14B:
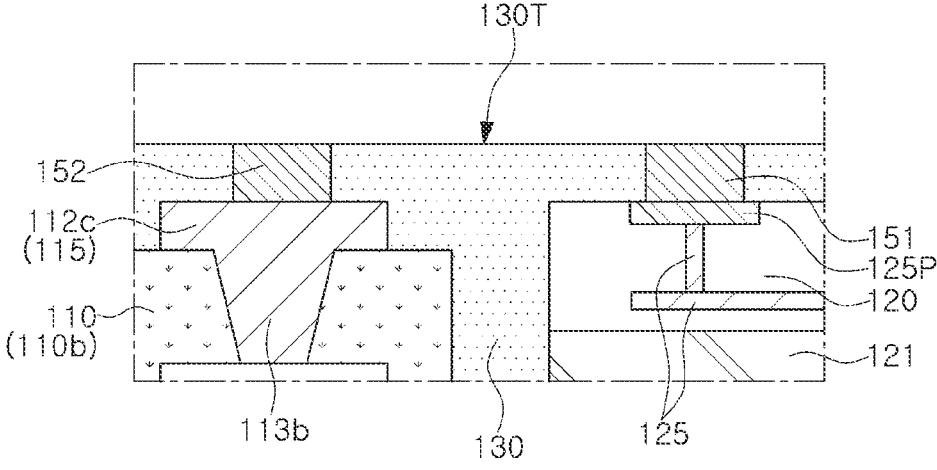

Referring to FIG. 14B, by grinding the encapsulant 130, the first and second conductive bumps 151 and 152 may be exposed on the upper surface 130T of the planarized encapsulant 130.

Figure 14C:
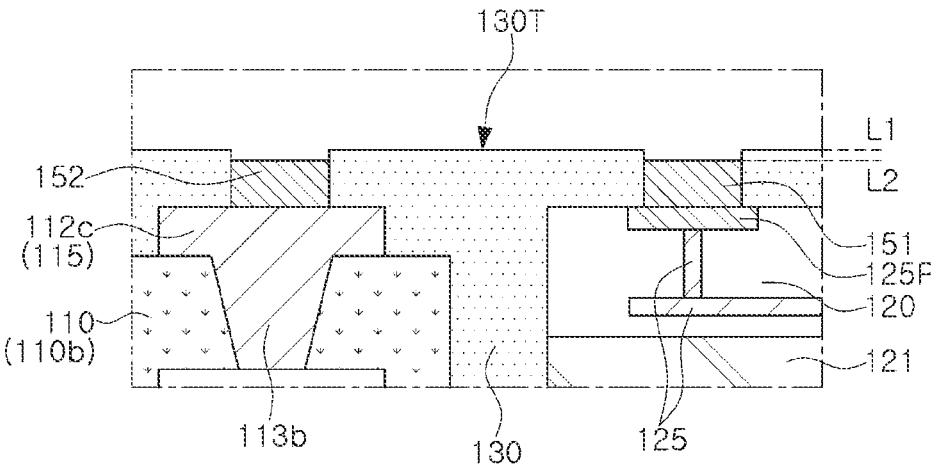

Referring to FIG. 14C, a post-treatment cleaning process (e.g., etching) may be performed to remove foreign substances generated by the grinding process and the laser drilling process, and in this process, the upper surface level L2 of the first and second conductive bumps 151 and 152 may be lower than the level L1 of the substantially flat upper surface 130T of the encapsulant 130.

Figure 14D:
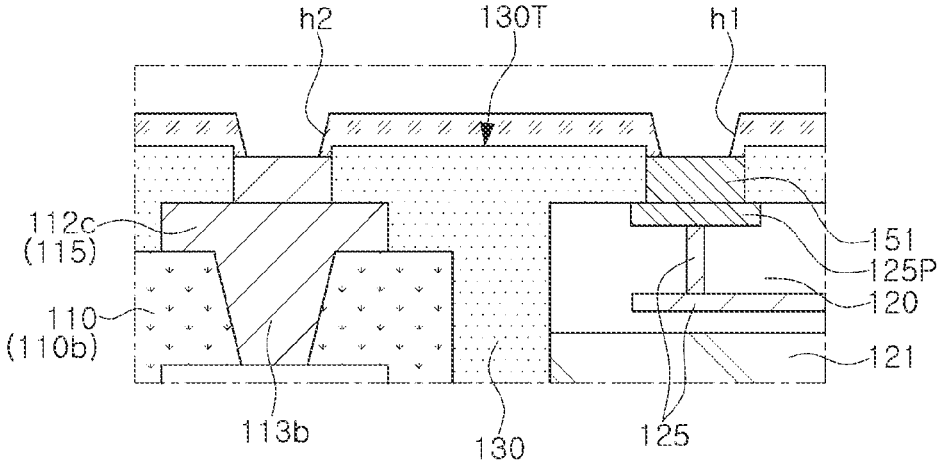

Referring to FIG. 14D, to form the second redistribution structure 160, the second insulating layer 161a is formed of a PID material, and the first and second holes h1 and h2 exposing the first and second conductive bumps 151 and 152, respectively, may be formed in the second insulating layer 161a, using a photolithography process. Additionally, a second redistribution structure may be formed by forming the second redistribution layer 165a using a plating process and repeating the forming process of the second insulating layer 161b and the second redistribution layer 165b once.

As set forth above, according to the above-described embodiments of the present inventive concept, the semiconductor interposer may be replaced by embedding a bridge die (e.g., a semiconductor bridge) interconnecting two or more semiconductor chips in an organic material-based substrate. For example, a warpage issue may be prevented or reduced by adjusting the thickness of the insulating layer of the upper and lower redistribution structures.

While the present inventive concept has been particularly shown and described with reference to example embodiments thereof, it will be understood by those of ordinary skill in the art that various changes in form and detail may be made therein without departing from the spirit and scope of the present inventive concept as defined by the following claims.

What is claimed is:

1. A semiconductor package, comprising:
a frame having a first surface and a second surface opposing each other, and including a wiring structure connecting the first and second surfaces, the frame having a through-hole;
a first redistribution structure disposed on the first surface of the frame, and including a first insulating layer and a first redistribution layer disposed on the first insulating layer and connected to the wiring structure;
a bridge die disposed in the through-hole and having an interconnector;
an encapsulant surrounding the bridge die, and covering the second surface of the frame, the encapsulant having a substantially flat upper surface;
a second redistribution structure disposed on the substantially flat upper surface of the encapsulant, and including a second insulating layer and a second redistribution layer disposed on the second insulating layer and connected to the interconnector and the wiring structure; and
a plurality of semiconductor chips disposed on the second redistribution structure, and connected to the second redistribution layer, the plurality of semiconductor chips electrically connected to each other through the interconnector,
wherein the first insulating layer includes at least one first insulating layer disposed on the first surface of the frame, and the second insulating layer includes a plurality of second insulating layers stacked on the substantially flat upper surface of the encapsulant, and
a number of the at least one first insulating layer is smaller than a number of the plurality of second insulating layers.

2. The semiconductor package of claim 1, wherein a thickness of each of the plurality of second insulating layers is smaller than a thickness of the at least one first insulating layer.

3. The semiconductor package of claim 1, wherein a level of an upper surface of the bridge die is about equal to or higher than a level of the second surface of the frame.

4. The semiconductor package of claim 1, wherein the bridge die includes a bonding pad disposed on an upper surface of the bridge die and connected to the interconnector, and the wiring structure has a wiring layer located on the second surface of the frame,
the encapsulant has a first hole exposing the bonding pad and a second hole exposing a contact area of the wiring layer, and
the second redistribution layer is disposed on the encapsulant and includes a redistribution pattern having a first via connected to the bonding pad through the first hole and a second via connected to the contact area through the second hole.

5. The semiconductor package of claim 1, wherein the bridge die includes a semiconductor block, and the interconnector is disposed on an upper surface of the semiconductor block.

6. The semiconductor package of claim 5, wherein the bridge die includes a through-via penetrating through the semiconductor block and connected to the interconnector,
wherein the through-via is connected to the first redistribution layer on a lower surface of the bridge die.

7. A semiconductor package, comprising:
a frame having a first surface and a second surface opposing each other, and including a wiring structure connecting the first and second surfaces, the frame having a through-hole;
a first redistribution structure disposed on the first surface of the frame, and including a first insulating layer and a first redistribution layer disposed on the first insulating layer and connected to the wiring structure;
a bridge die disposed in the through-hole and having an interconnector;
an encapsulant surrounding the bridge die, and covering the second surface of the frame, the encapsulant having a substantially flat upper surface;
a second redistribution structure disposed on the substantially flat upper surface of the encapsulant and including a second insulating layer and a second redistribution layer disposed on the second insulating layer and connected to the interconnector and the wiring structure; and
a plurality of semiconductor chips disposed on the second redistribution structure, and connected to the second redistribution layer, the plurality of semiconductor chips electrically connected to each other through the interconnector,
wherein the bridge die includes a first conductive bump disposed on an upper surface of the bridge die and connected to the interconnector, and
a level of an upper surface of the first conductive bump is lower than a level of the substantially flat upper surface of the encapsulant,
wherein the second redistribution layer includes a redistribution via connected to the upper surface of the first conductive bump.

8. The semiconductor package of claim 7, wherein the upper surface of the first conductive bump is about 0.2 μm to about 5 μm lower than the level of the substantially flat upper surface of the encapsulant.

9. The semiconductor package of claim 7, wherein the wiring structure has a wiring layer disposed on the second surface of the frame,
the encapsulant has a first hole exposing a contact area of the wiring layer, and
the second redistribution layer is connected to the contact area of the wiring layer through the first hole.

10. The semiconductor package of claim 9, wherein the contact area of the wiring layer has a recessed area disposed at a lower level than another region of the wiring layer covered by the encapsulant.

11. The semiconductor package of claim 9, wherein the second insulating layer is disposed on the substantially flat upper surface of the encapsulant, and includes a second hole exposing an upper surface region of the first conductive bump and a third hole exposing the contact area of the wiring layer, and
the second redistribution layer includes a redistribution pattern disposed on the second insulating layer, the redistribution pattern including a first via connected to the first conductive bump through the second hole and a second via connected to the contact area through the third hole.

12. The semiconductor package of claim 7, wherein the wiring structure includes a wiring layer disposed on the second surface of the frame and a second conductive bump disposed on the wiring layer, wherein a level of an upper surface of the second conductive bump is about equal to or lower than a level of the substantially flat upper surface of the encapsulant.

13. A semiconductor package, comprising:

a lower redistribution structure having a lower insulating layer and a lower redistribution layer disposed on the lower insulating layer;

a frame disposed on the lower redistribution structure, including a wiring structure connected to the lower redistribution layer, and having a through-hole;

a bridge die disposed on the lower redistribution structure, in the through-hole, and including a semiconductor block and an interconnector disposed on an upper surface of the semiconductor block;

an encapsulant surrounding the bridge die in the through-hole, extending onto a first surface of the frame, and having an upper surface;

an upper redistribution structure disposed on the encapsulant and including an upper insulating layer and an upper redistribution layer disposed on the upper insulating layer and connected to the interconnector; and a plurality of semiconductor chips disposed on the upper redistribution structure, and connected to the upper redistribution layer, the plurality of semiconductor chips electrically connected to each other through the interconnector, wherein the bridge die includes a conductive bump disposed on an upper surface of the bridge die and connected to the interconnector, the conductive bump having an upper surface disposed at a level lower than a level of the upper surface of the encapsulant.

14. The semiconductor package of claim 13, wherein the frame has an additional through-hole, wherein the semiconductor package further includes a capacitor chip disposed in the additional through-hole.

15. The semiconductor package of claim 14, wherein the capacitor chip has an upper surface on which a plurality of contact pads are arranged, and the plurality of contact pads are respectively connected to the upper redistribution layer.

16. The semiconductor package of claim 13, wherein a number of layers included in the lower insulating layer is greater than a number of layers included in the upper insulating layer, wherein a thickness of the lower insulating layer is smaller than a thickness of the upper insulating layer.

17. The semiconductor package of claim 13, wherein the wiring structure has a wiring layer located on a second surface of the frame, the encapsulant has a first hole exposing a contact area of the wiring layer, and the contact area of the wiring layer has a recessed area disposed at a lower level than another area of the wiring layer covered by the encapsulant.

18. The semiconductor package of claim 17, wherein the upper insulating layer is disposed on the upper surface of the encapsulant and includes a second hole exposing an upper surface region of the conductive bump and a third hole exposing the contact area of the wiring layer, and the upper redistribution layer includes a redistribution pattern disposed on the upper insulating layer and includes a first via connected to the conductive bump through the second hole and a second via connected to the contact area through the third hole.

* * * * *